United States Patent [19]

Hoang

[11] Patent Number: 5,406,228
[45] Date of Patent: Apr. 11, 1995

[54] RING OSCILLATOR WITH FREQUENCY CONTROL LOOP

[75] Inventor: Chinh L. Hoang, San Diego, Calif.

[73] Assignee: General Instrument, Hatboro, Pa.

[21] Appl. No.: 274,011

[22] Filed: Jul. 12, 1994

[51] Int. Cl.[6] ..................... H03K 3/354; H03L 7/099
[52] U.S. Cl. ........................ 331/1 A; 331/8;
   331/14; 331/17; 331/25; 331/34; 331/57
[58] Field of Search ..................... 331/1 A, 8, 14, 17,
   331/25, 34, 57

[56] References Cited

U.S. PATENT DOCUMENTS 4,893,095 1/1990 Thommen ............................ 331/57
5,136,260 8/1992 Yousefi-Elezei ..................... 331/57

Primary Examiner—Siegfried H. Grimm
Attorney, Agent, or Firm—Irwin Ostroff; Edward P. Brandeau

[57] ABSTRACT

An oscillator system and method in which a time period (inverse of frequency) of a multi-stage ring oscillator (ROSC) is adjusted by a bias current which controls the charging and discharging times of respective capacitors (e.g., interelectrode capacities) within each stage. The time periods of the unadjusted oscillator are counted along with the time periods of a reference clock over a same period of time and a count difference between the two counts is determined. The count difference is applied by a logic circuit in accordance with an algorithm relating count differences to incremental bias current levels to adjust the frequency of the oscillator. The logic circuit generates digital gate signals corresponding to the count difference and these signals automatically select the bias current level needed to bring the oscillator frequency into close agreement with the reference clock frequency. The digital gate signals are stored in a non-volatile memory so that the oscillator will continue to operate at the adjusted frequency (i.e., that of the reference clock) even if the reference clock is no longer present and power is temporarily removed. The oscillator system is well suited for implementation by complementary metal oxide semiconductor (CMOS) technology as part of an integrated circuit (IC).

26 Claims, 11 Drawing Sheets

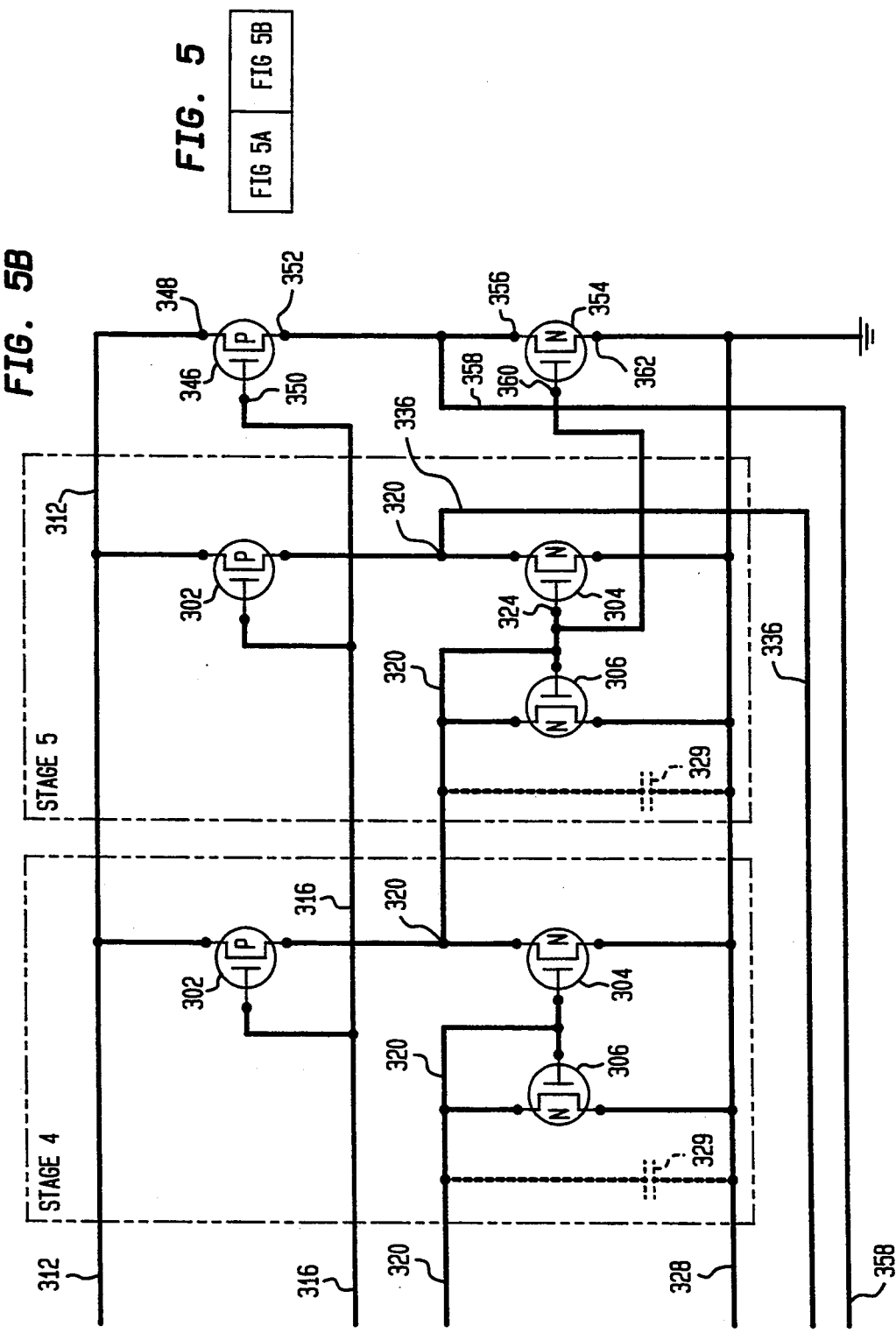

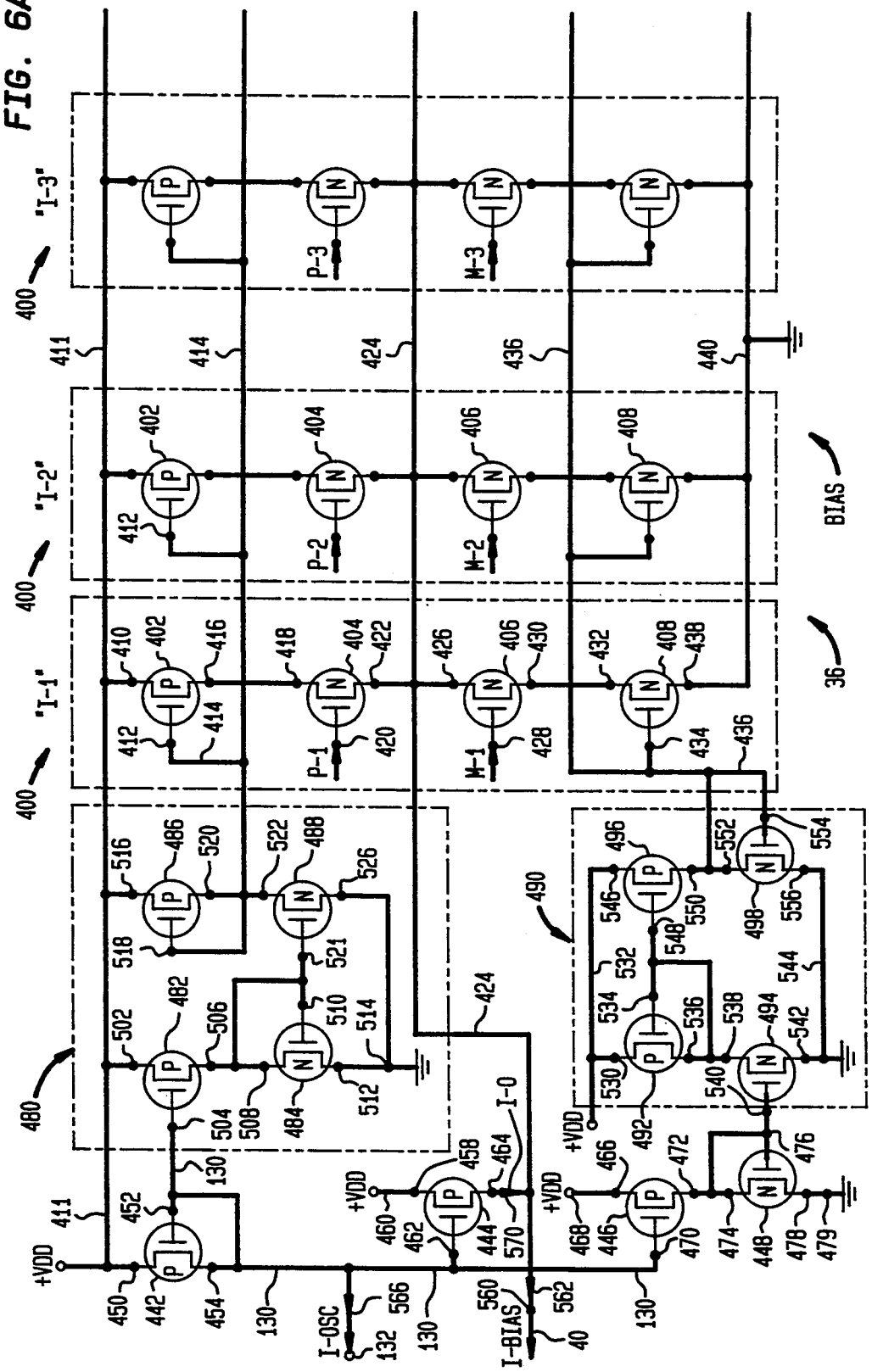

RING OSCILLATOR WITH FREQUENCY CONTROL LOOP

FIELD OF THE INVENTION

This invention relates to an oscillator system which operates at a frequency which can be accurately set, and to a method of operation thereof.

BACKGROUND OF THE INVENTION

There are numerous electronic circuit applications where, for proper operation, it is necessary to provide precise timing or synchronization of one portion of a circuit with another. Such timing is conveniently provided by a local oscillator whose frequency is sufficiently accurate for the requirements of the circuit being timed or synchronized. Depending on the degree of accuracy required, an oscillator may be very simple and inexpensive where frequency range can have wide latitude on the one hand, or relatively complex and expensive where a high degree of accuracy (less than a few percent error) in frequency is required. It is desirable to have an oscillator which is both simple and inexpensive and which operates at an accurate frequency.

Complementary metal oxide semiconductor (CMOS) manufacturing technology is highly developed, and for many applications, is the technology of choice in designing and implementing large scale integrated circuits.

Various kinds of oscillators have been used for onboard timing of other circuitry on a CMOS integrated circuit (IC). One kind of oscillator which lends itself particularly well to implementation by CMOS technology is a ring oscillator. In this kind of oscillator there are no inductor-capacitor tuned circuits which in other oscillators are used to accurately set the frequency of operation. Instead of tuned circuits, a ring oscillator has an odd number of identical and very simple inverting stages connected in series, with an output of each stage coupled to an input of the next stage and with the output of the last stage coupled to the input of the first stage. In one embodiment each stage is an inverter having a pair of serially connected complementary metal-oxide-semiconductor (MOS) transistors whose output switches to a high level, a "1", when a low level, a "0" is applied to the input thereof, and switches to a "0" when a "1" is applied to the input thereof. The frequency of operation of this type of oscillator is determined by the speed of progression of a switching event of "1" to "0", and "0" to "1" from one stage to another around the ring, and by the number of stages.

A conventional ring oscillator implemented in CMOS technology as part of an IC chip may have its own frequency of operation within a very wide range of frequencies. Thus, by way of example, in one ring oscillator currently being manufactured as part of a CMOS IC chip, the difference in frequency of the oscillator of one chip from the frequency of the oscillator of another supposedly identical chip can be as great as 3 to 1. This wide range of frequency of operation is caused by physical and dimensional variations inherent in the manufacturing process and by normal temperature and supply voltage changes. Obviously, where precise timing of a circuit is required (e.g., frequency accuracy to within a few percent), such a wide frequency range as this is unacceptable.

It is desirable to have a CMOS ring oscillator which is relatively inexpensive and whose frequency can be set to a desired level of accuracy. The present invention provides an effective and inexpensive solution to this problem of accuracy in frequency of operation of ring oscillators.

SUMMARY OF THE INVENTION

In one illustrative embodiment of the invention there is provided an oscillator system implemented entirely in CMOS technology as part of an integrated circuit (IC) chip. The oscillator system comprises a ring oscillator (ROSC), a logic counter and comparator (LCC) unit, a bias unit, a multiplexer, and a memory. The operating frequency of the ring oscillator is very accurately controlled automatically by a settable bias current applied to it by the bias unit. The latter in turn is controlled by the LCC unit which operates initially to compare the frequency of the ROSC with that of an external reference clock signal (REF CLOCK). If the frequency of the ROSC is slower than that of the reference clock signal, the LCC automatically controls the bias unit to increase, by a selected number of small digital increments, the current applied to the ROSC to thereby increase its frequency to match that of the reference clock. Conversely, if the frequency of the ROSC is higher than that of the reference clock, the bias current is automatically decreased by a suitable number of small step-like increments thereby decreasing the frequency of the oscillator (ROSC) until it matches that of the reference clock. Thus by increasing or decreasing in small increments the bias current applied to the ring oscillator, its frequency can be precisely matched to that of the reference clock. Once the bias current has been adjusted to that value which gives a frequency of operation of the ring oscillator that accurately matches the frequency of the reference clock signal, the digital settings of the bias unit which control the bias current are entered into the memory and the reference clock signal is disconnected. Thereafter, even though main power for the IC chip and the oscillator system is disconnected, the memory retains the appropriate digital settings for the bias unit so that when power is restored, the necessary value of bias current is once again applied to the ring oscillator so as to generate the needed frequency of oscillation. Thus, the ring oscillator will operate thereafter, within very close limits, at that frequency previously determined by the reference clock.

The ROSC is integral with the IC chip and therefore there is added security against a non-authorized person from easily determining its exact frequency of operation. Knowledge of the frequency might enable someone to gain unauthorized access to restricted information such as a pay-per-view cable TV channel.

The present oscillator system permits the automatic, immediate and very accurate setting of the frequency of the ring oscillator on each IC chip even though manufacturing tolerances and component variations would otherwise cause their respective uncorrected frequencies to differ considerably (e.g., typically by more than 2 to 1).

Viewed from another aspect, the present invention is directed to an oscillator system comprising an oscillator, reference clock means, clock counter and control means, logic means, and bias means. The oscillator has a plurality of n essentially identical inverting stages each having an input and an output with the output of each stage being coupled to the input of the next stage and with the output of a last stage being coupled to the input of a first stage, where n is an odd integer greater than one. Each of the n stages comprises capacitor means for selectively storing electrical charge, an adjustable source of electrical charge coupled to the capacitor means, and switch means, which is coupled to the capacitance means, for selectively facilitating charging/discharging of the capacitive means so as to control frequency and corresponding time period of an output signal generated by the oscillator at the oscillator output during operation. The reference clock means receives a reference clock signal having a preselected frequency and corresponding time period. The counter and control means separately counts over a same period of time a number of oscillator time periods and a number of reference clock signal time periods and generates a count difference between the respective counts of the time periods. The logic means, which is responsive to the count difference generated by the counter and control means, generates control signals corresponding to the count difference. The bias means, which is responsive to the control signals generated by the logic means and is coupled to the sources of electric charge, controls the respective sources of electric charge of the oscillator stages such that the frequency of the oscillator is adjusted in accordance with the count difference so as to ensure that the oscillator frequency is in close agreement with the frequency of the reference clock signal.

Viewed from still another aspect, the present invention is directed to an oscillator system comprising a ring oscillator (ROSC), bias means, and logic counter comparator (LCC) means. The ring oscillator (ROSC) comprises an odd plurality of n inverting stages, each stage having a constant current source transistor with a control electrode and having a switch transistor pair with a control electrode. An output of the switch transistor pair is coupled in series with the current source transistor. Each stage has an output coupled to a control electrode of a switch transistor pair of the next stage with the output of a last stage being coupled to the electrode of the switch transistor of a first stage. The bias means, which is coupled to the control electrodes of the current source transistors of the n stages, determines the current through each current source transistor. The logic counter comparator (LCC) means, which is coupled by an output thereof to an input of the bias means, compares the frequency of the ROSC with that of a reference clock signal, determines a numerical difference between the two frequencies, and generates at the output thereof signals representative of such difference such that the bias means generates signals which are coupled to the ROSC that ensure that the oscillator frequency is in close agreement with the frequency of the reference clock signal.

Viewed from still another aspect, the present invention is directed to a method of operating an oscillator having an odd plurality of n inverting stages, each stage having an input, an output, a capacitor, an adjustable source of current for charging the capacitor in the following stage, and a switch for discharging the capacitor in the following stage, the output of a first stage being coupled to an input of the second stage and so on to the nth stage whose output is coupled back to the input of a first stage. The method comprising a first step of charging the load capacitor of a first stage from the adjustable current source thereof. A second step of discharging the load capacitor of a second stage through the switch of that second stage in response to the charging of the load capacitor of the first stage. A third step of charging the load capacitor of a third stage from the adjustable current source thereof in response to the discharging of the load capacitor of the second stage, and so on from one successive stage to the next continually around in a ring of the n stages. A fourth step of comparing a frequency of the oscillator with a frequency of a reference clock signal by simultaneously counting in separate counts a number of time periods of oscillation of the oscillator and the reference clock signal until a predetermined count is reached in either count and then discontinuing counting. A fifth step of determining a count difference between the counts. A sixth step of providing for incremental changes in a number of steps in the currents provided by the adjustable sources of current in the plurality of stages; and a seventh step of making changes in the currents provided by the adjustable sources of current in accordance with the determined count difference such that the frequency of oscillation of the oscillator is adjusted to closely match the frequency of the reference clock signal.

Viewed from still another aspect, the present invention is directed to a method of controlling the frequency of operation of an oscillator. The method comprises a first step of arranging an odd plurality of n capacitors with charging current sources and discharging switches in a ring configuration to form an oscillator. A second step of using charging currents to selectively charge a first capacitor of the n capacitors to cause a discharging through a switch of a second capacitor of the n capacitors, and the discharging of the second capacitor to cause charging currents to charge a third capacitor of the n capacitors, and so on in sequence to an nth capacitor and then back to the first capacitor in a continual sequence of capacitor charging and discharging events which results in an output signal having a frequency and corresponding time period. A third step of comparing the frequency of the oscillator with the frequency of a reference clock signal to determine the difference therein; and a fourth step of adjusting the values of charging currents into the capacitors in accordance with the determined difference between the frequency of the oscillator and the frequency of the reference clock signal so as to cause the frequency of the oscillator to be adjusted so as to be close to the frequency of the reference clock signal.

A better understanding of the invention together with a fuller appreciation of its important advantages will best be gained from a study of the following description given in conjunction with the accompanying drawings and claims.

BRIEF DESCRIPTION OF THE DRAWINGS

FIG. 5 shows how FIGS. 5A and 5B are coupled together; FIGS. 5A and 5B show a detailed circuit diagram of a ring oscillator (ROSC) useful in the oscillator system of FIG. 1;

FIGS. 6A and 6B are coupled together; FIGS. 6A and 6B show a detailed circuit diagram of a bias unit useful in the oscillator system of FIG. 1.

FIG. 8 shows how FIGS. 8A and 8B show a detailed diagram of a logic and switching circuit forming another portion of the logic counter comparator (LCC).

DETAILED DESCRIPTION

Figure 1:
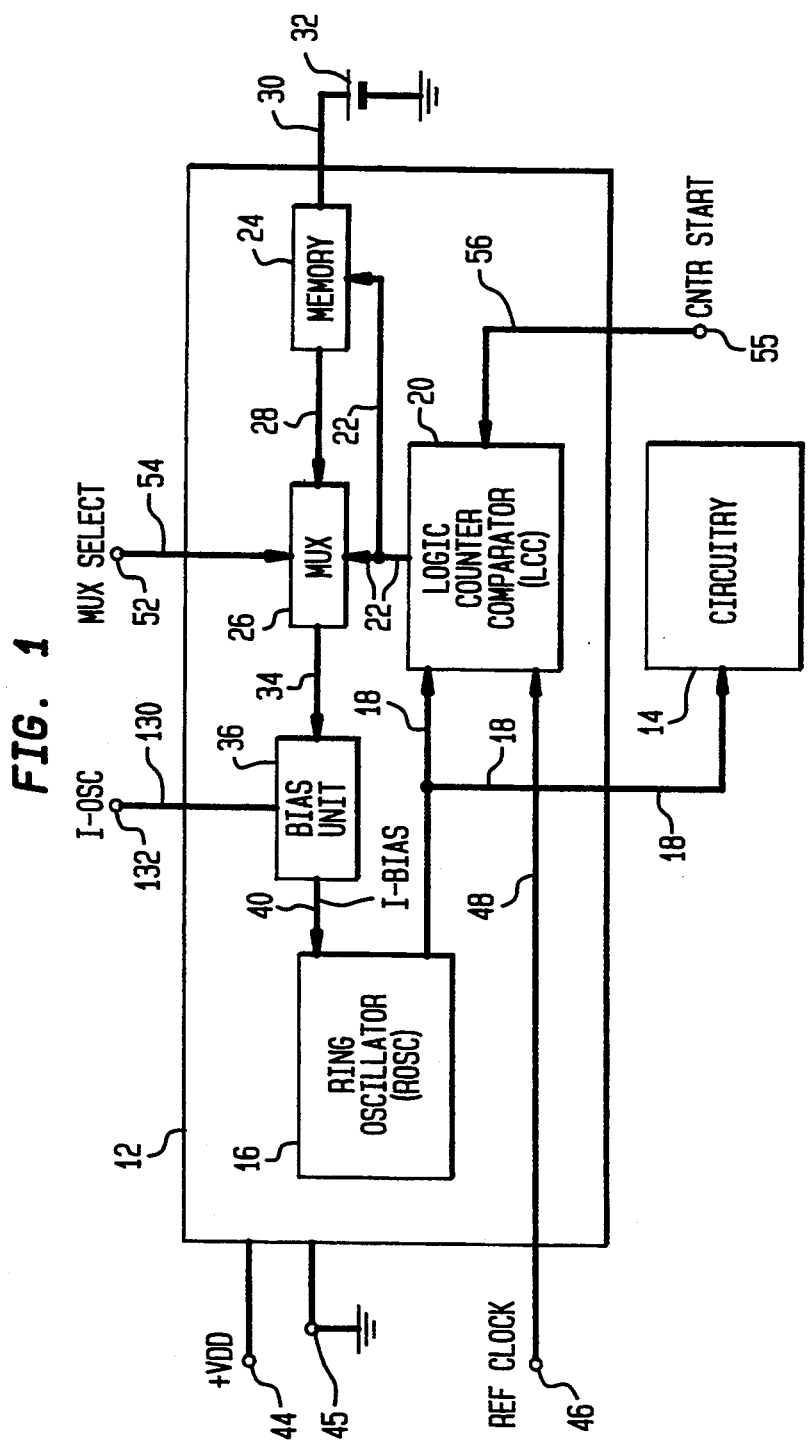
FIG. 1 is a schematic representation in block diagram form of an oscillator system in accordance with the present invention.

Referring now to FIG. 1, there is shown in block diagram form, an oscillator system 12 (shown within a solid line rectangle) in accordance with the present invention which has an output which is coupled via a lead 18 to circuitry 14. Oscillator system 12 generates on lead 18 a signal having a frequency which is needed by circuitry 14. A battery 32 is shown coupled by a positive terminal thereof to a memory 24 of oscillator 12.

The oscillator system 12 comprises a ring oscillator (ROSC) 16, a bias unit 36, a multiplexer (MUX) 26, the memory 24, and a logic counter comparator (LCC) 20. The lead 18 also couples an output of the ring oscillator 16 to an input of the LCC 20. An output of LCC 20 is coupled via a common lead 22 to an input of memory 24 and to an input of multiplexer (MUX) 26. The memory 24 is connected via a lead 28 to another input of the MUX 26. Battery 32 insures retention of data in the memory 24 when external power to the oscillator system 12 is disconnected. Memory 24 could be a nonvolatile type of memory and would not require a battery 32 to retain stored memory for a useful period of time. An output of the MUX 26 is connected via a multi-conductor lead 34 to the bias unit 36 which in turn is connected via a lead 40 to the ROSC 16. During operation of oscillator system 12 a current I-bias flows from an output of bias unit 36 via a lead 40 to an input of ROSC 16. The current I-bias controls the frequency of operation of ROSC 16. The oscillator system 12 has a pair of power supply terminals 44 and 45 to which external voltages, such as +VDD and ground, respectively, are selectively connected. Similarly, oscillator system 12 has a terminal 46 (REF CLOCK) to which an external reference clock signal (not shown) having a preselected frequency can be selectively connected. The terminal 46 is connected via a lead 48, to an input of the LCC 20. The oscillator system 12 also has a terminal 52 to which an external "MUX SELECT" signal can be selectively applied to control via a lead 54 the setting of the MUX 26. When temporarily set in one position, the MUX 26 applies digital control data from the LCC 20 directly to the bias unit 36. When set in another (long term) position, the MUX 26 applies the contents of the memory 24 to the bias unit 36. The contents of memory 24 are the same as the digital control data from the LCC 20 right after a calibration process (described hereinafter). The calibration process is initiated by a start signal (from a source not shown) applied to a terminal (CNTR START) 55 and via a lead 56 to the LCC 20. A terminal 132 is coupled via a lead 130 to bias unit 36. During operation of oscillator system 12 a current I-OSC is established in bias unit 36 which flows via lead 130 into terminal 132. A constant current source (not shown) is coupled to terminal 132 and is typically a band gap current generator which generates a constant current level substantially independent of power supply and temperature variations over useful ranges.

Oscillator system 12 is typically formed in an integrated circuit chip. Circuitry 14 can optionally be formed on the same integrated circuit chip as oscillator system 12 and may comprise the largest portion of the chip. In a preferred embodiment oscillator system 12 is formed in an integrated circuit chip using CMOS components and circuitry 14, which would also use CMOS components, is also formed in the same integrated circuit chip. The operation of the circuitry 14 is determined by whatever application it is designed for. The oscillator system 12 provides timing or synchronization via the lead 18 to the circuitry 14.

An overall view of the operation of oscillator system 12 is as follows. When external power (+VDD and ground) is applied to terminals 44 and 45, respectively, of the oscillator system 12, the ROSC 16 oscillates at a frequency determined by its basic design. This frequency is controlled by variables such as voltage and temperature, by physical and dimensional differences due to manufacturing tolerances, and by a control current applied to it via the lead 40 from the bias unit 36. Because of these factors and without any control of the current from the bias unit 36, the ROSC 16 may operate at a frequency greatly different from the frequency desired for operation of circuitry 14.

The design of the ROSC 16 is such that by incrementing control current on the lead 40 above or below a median or nominal value, the frequency of the ROSC 16 can be adjusted to a desired value (within a few percent). To make this adjustment, a reference clock (not shown), operating precisely at the desired frequency, is coupled to the "REF CLOCK" terminal 46. When a start signal is applied to the terminal 55, the calibration process begins and the LCC unit 20 automatically compares the frequency of the reference clock with that of the ROSC 16. If the frequency of the ROSC 16 is higher than that of the reference clock, the count of time periods (cycles) of oscillation of the ROSC 16 starting at a given time reaches a predetermined number (e.g., "1") somewhat sooner than the count of time periods of the reference clock. On the other hand, if the frequency of the ROSC 16 is lower than that of the reference clock, the count of time periods of the reference clock reaches a predetermined number (e.g., "1") somewhat sooner than the count of time periods of the ROSC 16. In either event, the difference in the numbers of cycles counted between the two frequencies is then detected and decoded within the LCC 20. The LCC 20 then applies, according to a preselected algorithm, a number of separate digital "on" or "off" signals via the common multi-conductor lead 22 through the MUX 26 to the bias unit 36. At the same time these digital signals are also provided to and stored in the memory 24.

The digital signals from the LCC 20 control the settings of respective switches (not shown here but shown in FIG. 3 and described in detail hereinafter) within the bias unit 36. In this way the control current applied via the lead 40 from the bias unit 36 to the ROSC 16 is set to a value which causes the frequency of operation of the ROSC 16 to match (within a few percent) the frequency of the reference clock. These same digital signals from the LCC 20 are stored in the memory unit 24 so that, even though main power to the oscillator system 12 is disconnected and the reference clock removed, when power is restored, these digital signals are automatically re-applied from memory unit 24 through the MUX 26 to the bias unit 36 and the proper value of control current is again applied to the lead 40. The ROSC 16 thus operates at the desired frequency (i.e., that of the reference clock even though it is no longer present).

Oscillator system 12 is fully automatic and very accurate. The operation of comparing frequencies within the LCC 20 and of setting the control current on the lead 40 to the ROSC 16 takes only a small fraction of a second. This is called the calibration process. Once the frequency of the ROSC 16 has been set, it remains set at the frequency of the reference clock until, if desired, it is reset by repeating the above-described process of comparison with a reference clock (calibration process) by applying a new CNTR START signal to the terminal 55 and the reference clock frequency to the terminal 46.

Figure 2:
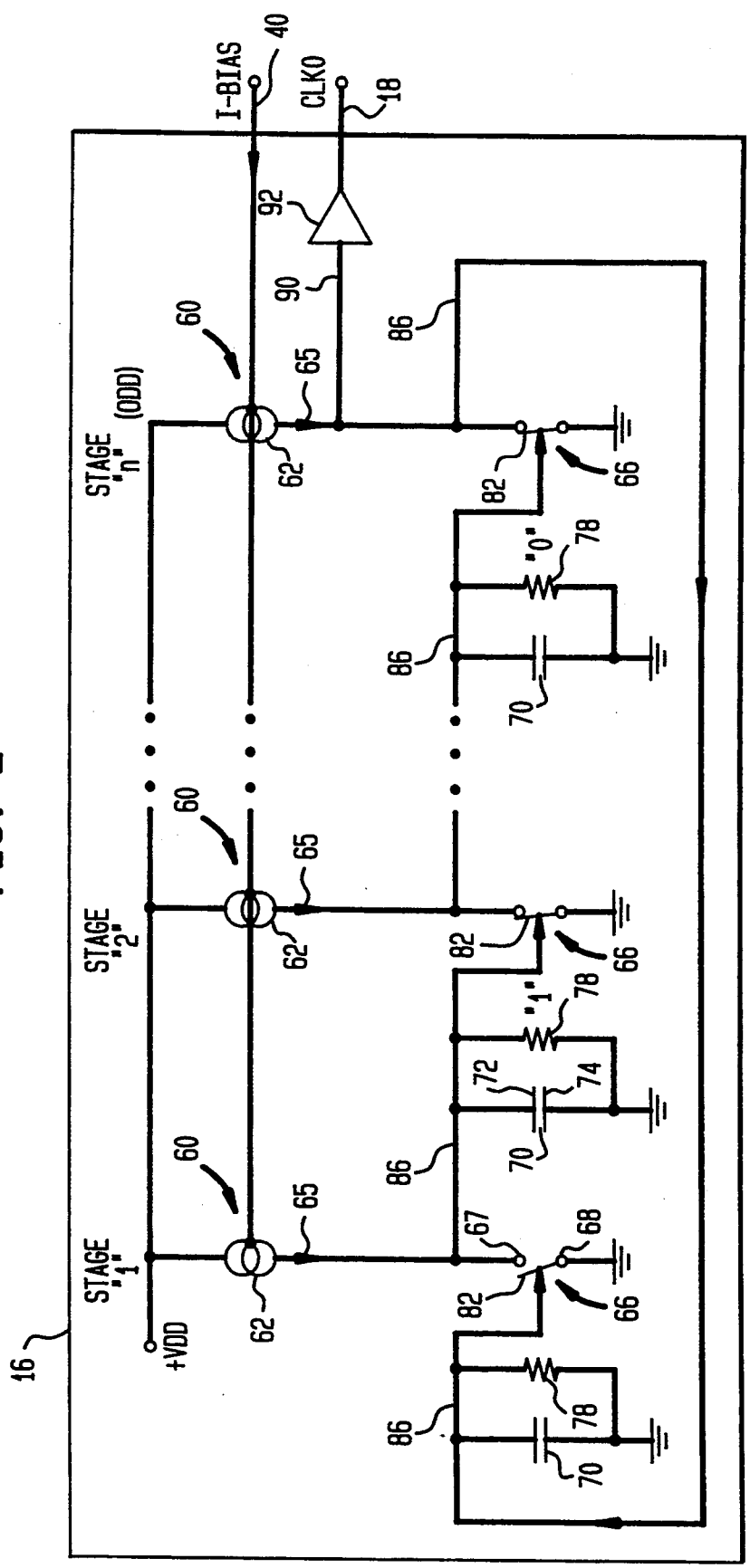
FIG. 2 is a schematic representation of a ring oscillator (ROSC) useful in the oscillator system of FIG. 1.

Referring now to FIG. 2, there is shown, in basic schematic form one illustrative embodiment of the ROSC 16 of FIG. 1. Additional details will be given hereinafter. As shown here, the ROSC 16 has "n" essentially identical switching stages 60 (only stage 1, stage 2, and stage "n" being shown). Respective elements of each stage 60 are given the same reference numbers. The input control current from the bias unit 36 applied to the ROSC 16 via the lead 40 is here identified as "I-bias". Each switching stage 60 comprises a constant current generator 62, the current from which is controlled by "I-bias". The current from the generator 62 flows in the direction of an arrow 65. The current generator 62 is connected in series with a switch 66 having an upper terminal 67 connected to the current generator 62 and having a lower terminal 68 connected to ground. A capacitor 70, belonging to the following (next) stage and connected in parallel with the switch 66, has an upper electrode 72 connected to the terminal 67 and has a lower electrode 74 connected to the terminal 68 (ground). The capacitor 70 has in parallel with it an impedance 78, which represents the impedance of a transistor (not shown here) which at times is "on" and at other times "off". An output of each of the "n" stages is coupled to an input of the next stage via a conductor 86 with the output of the "nth" stage coupled to the input of the first (1) stage. These and other elements of the ROSC 16 will be described in detail hereinafter.

The switch 66 of Stage 1 of the switching stages 60 is shown, by way of example, in the "open" position indicated here by the position of a solid line 82. As will be explained hereinafter these switches 66 are in reality transistors (not shown here). It will be noted, in the example given here, that the switch 66 of Stage 2 is in the "closed" position (indicated by the position of the solid line 82) and so on, to Stage "n" where the position of the switch 66 is closed (indicated by the position of the line 82). There are always an "odd" number "n" of the stages 60 (see FIG. 2).

In a preferred embodiment, the capacitor 70 of each stage 60 represents the interelectrode parasitic capacitances of transistors (not shown here) associated with that stage. The capacitor 70, while typically very small (e.g., femtofarads), nonetheless affects the switching time of each stage 60 in going from "off" (digital "0") to "on" (digital "1") and vice versa (discharging time is as important as charging time). Thus, when the switch 66 of Stage 1 is initially switched from closed to open, the charge and voltage on the capacitor 70 of Stage 2 are substantially zero (digital "0"). As charging current begins to flow from the current generator 62 of Stage 1 in the direction of the arrow 65 around the now-open switch 66, the charge and voltage across the capacitor 70 of Stage 2 builds up to a full value (digital "1") which remains so long as the switch 66 of Stage 1 remains open.

After a short time, the charge on the capacitor 70 of Stage 2 reaches a level which causes the respective switch 66 of Stage 2 to switch from an open to a closed position. When the switch 66 of the Stage 2 is closed, the capacitor 70 of Stage n is discharged through the respective switch 66 of Stage 2 and a digital "0" is thereupon stored on this respective capacitor 70 of Stage n. When the voltage on the capacitor 70 of the Stage n has dropped to a low enough level (near zero), the respective switch 66 of the Stage n (here, Stage "n" is after Stage 2, Stage 3 not being shown) is actuated from a closed to an open position, and the respective capacitor 70 of that odd numbered stage 60 is charged to a digital "1". This sequential actuation of the respective switches 66 and the charging and discharging of the respective capacitors 70 of the stages 60 progresses during a cumulative time through the series of stages 60 from the first to the last (Stage "1" to Stage "n").

Stage "n" is connected via a lead 90 to an input of a buffer-amplifier 92 whose output is coupled to a lead 18 (see FIG. 1) where the clock output signal (CLKO) of the ROSC 16 is produced. A switching signal from Stage "n" is applied via the respective conductor 86 to the switch 66 of Stage 1. When the switch 66 of Stage "n" switches "open" to store a digital "1", the switch 66 of Stage 1, after a short delay, switches to a "closed" position which effectively stores a digital "0" in Stage 1. When the switch 66 of Stage "n" switches closed, which stores a "0" in Stage "n", the switch 66 of Stage 1 switches to an "open" position and so on in sequence continuously around the ring of stages 60.

It will be appreciated by those skilled in the art that the time required for the respective capacitor 70 of a switching stage 60 to charge to a digital "1" or to discharge to a digital "0" through the controlled switch 66 is a function among other things of the amplitude of the charging current applied to it by the respective current generator 62 of that stage. This current from the generator 62 is controlled by the I-bias current. An important feature of the invention is that the operating frequency of the ROSC 16 (output signal CLKO) is accurately adjusted by controlling the amplitude of the I-bias current. This will be explained in greater detail hereinafter. Thus the frequency of the output signal CLKO of the ROSC 16 is electronically controlled automatically to match (within a few percent) the frequency of a reference clock in spite of circuit component variations and of normal operating changes in supply voltage and temperature.

Figure 3:
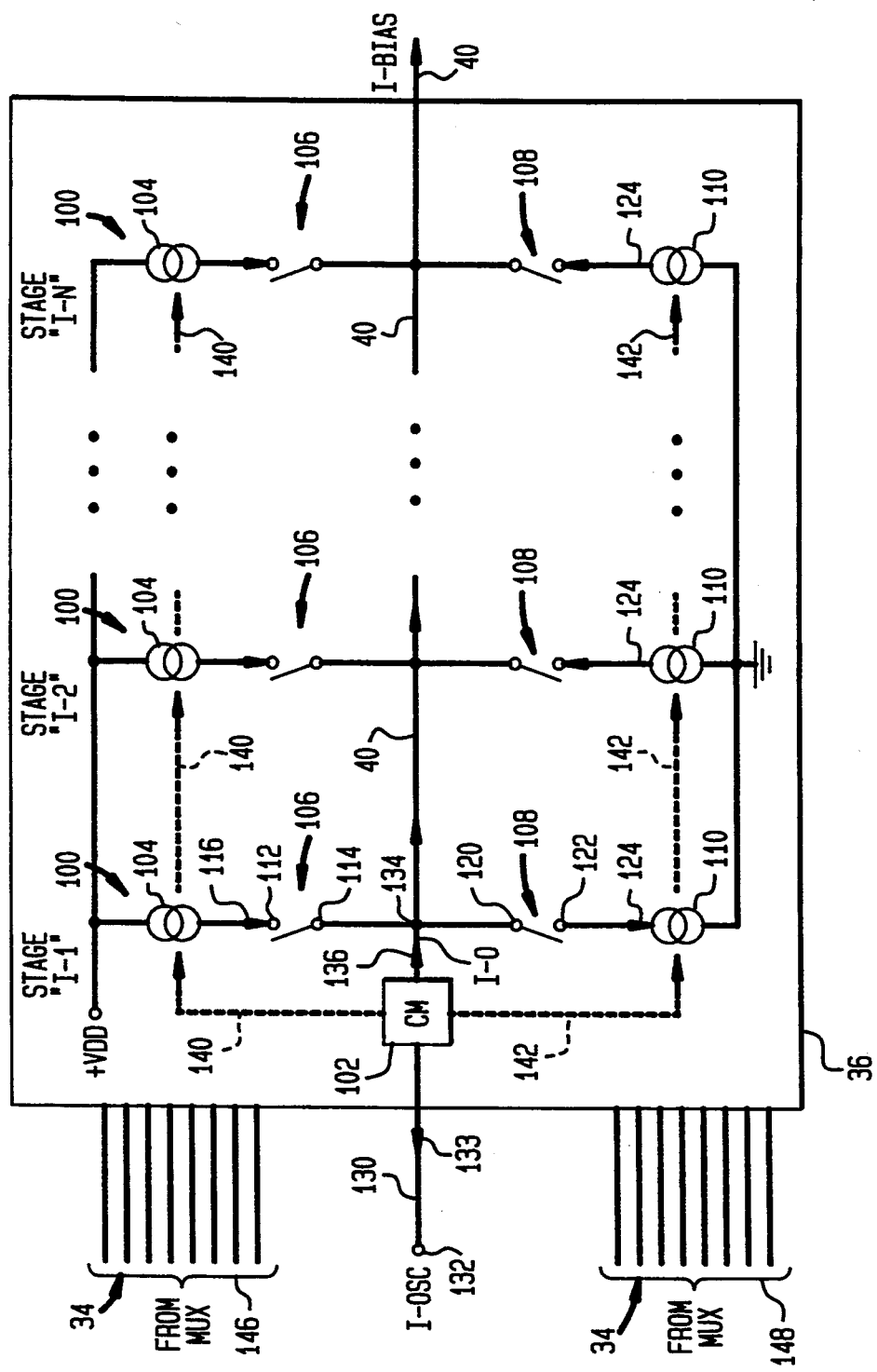
FIG. 3 is a schematic representation of a bias unit useful in the oscillator system of FIG. 1.

Referring now to FIG. 3, there is shown an illustrative, abbreviated schematic form of the bias unit 36 of FIG. 1. Output control current I-bias from the bias unit 36 is applied via the lead 40 to the ROSC 16 (see also FIGS. 1 and 2). The bias unit 36 comprises a number of current stages "I-1" through "I-N", each current stage being generally indicated at 100, and a current mirror (CM) unit 102 which serves also as a current divider. These "N" current stages 100 (only three, I-1, I-2, and I-N, of which are shown) are typically identical to each other and corresponding elements of each of the stages 100 have the same respective reference numbers.

Each current stage 100 comprises a series connection of a first current generator 104, a first (upper) switch 106 (shown open), a second (lower) switch 108 (shown open) and a second current generator 110. The switch 106 has an upper terminal 112 connected to the generator 104, and a lower terminal 114 connected to the lead 40 and to a terminal 134. Current flows from the first generator 104 (when the switch 106 is closed) in the direction of an arrow 116. The lower switch 108 has an upper terminal 120 connected to the lead 40 and to the terminal 134 and a lower terminal 122 connected to the second generator 110. Current flows from the generator 110 (when the switch 108 is closed) downward to ground in the direction of an arrow 124. All of the upper switches 106 and the lower switches 108 of the Stages I-1 through I-N may be open at the same time (as shown here), but whenever any upper switch 106 is closed, all of the lower switches 108 are open, and vice versa. Thus when an upper switch 106 of any current stage 100 is closed, the current from the respective current generator 104 flows in the direction of the arrow 116 into the lead 40, and all of the lower switches 108 are open. When a lower switch 108 of any current stage 100 is closed, current from the respective lower current generator 110 flows in the direction of the arrow 124 out of the lead 40 to ground. At this time all of the upper switches 106 are open.

The CM unit 102 is connected via a lead 130 to an input terminal 132. A reverse current "I-OSC", which remains highly constant even when there are normal voltage supply variation and temperature variations, is applied to the input terminal 132 from a current source (not shown). The current "I-OSC" flows in the direction of an arrow 133. The CM unit 102 applies to the terminal 134, a constant current "I-0" which flows in the direction of an arrow 136 into the lead 40. The current "I-0" may, for example, have an amplitude equal to that of "I-OSC", and is highly stable. The Cm unit 102 controls the amplitude of the respective currents (as will be explained in detail hereinafter) from each of the upper current generators 104 and from each of the lower current generators 110, as indicated here by the upper dashed line arrows 140 respective to the upper generators 104, and the lower dashed line arrows 142 respective to the lower generators 110. There may be, for example, eight current stages 100, and each current generator 104 or 110 may produce a small, exactly determined fraction of the current "I-0" applied to the lead 40 by the CM 102.

Depending on the controlled closings of one or more of the upper switches 106, or alternatively the closings of one or more of the lower switches 108 of the current stages 100, current is either incrementally added to the lead 40 in addition to the current "I-0" from the CM unit 102, or current is incrementally subtracted from the current on the lead 40. The output current "I-bias" on the lead 40 is thus the current "I-0" with small, precisely determined incremental additions (or subtractions) of current provided by the current stages 100. The settings of the upper switches 106 and the lower switches 108 are controlled, as will be explained in detail hereinafter, by separate "on" or "off" digital signals applied respectively to the switches via the multi-conductor lead 34 (see FIG. 1). Here (FIG. 3), the lead 34 is illustrated as having a multiple conductor upper portion 146 and a multiple conductor lower portion 148.

Figure 4:
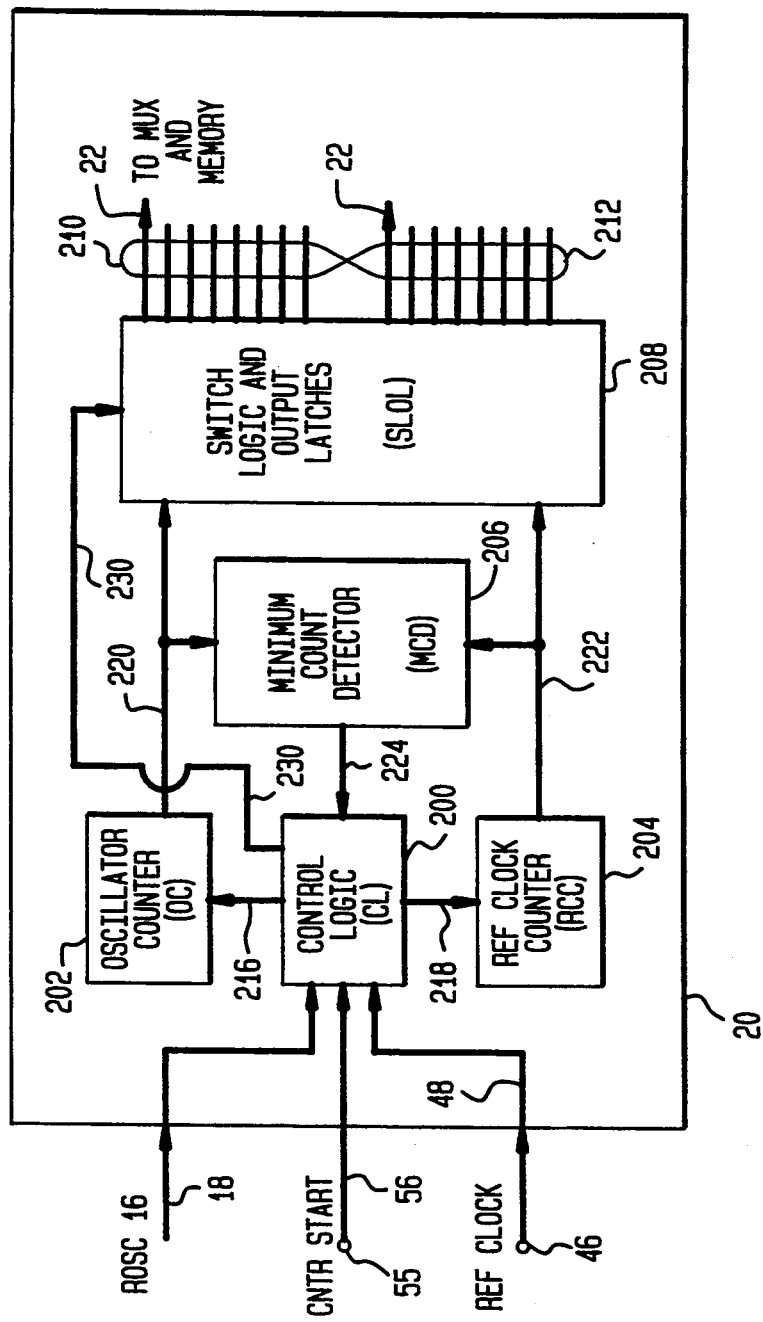
FIG. 4 is a schematic representation, in block diagram form, of a logic counter comparator (LCC) unit useful in the oscillator system of FIG. 1.

Referring now to FIG. 4, there is shown an illustrative embodiment of functional portions in block form of the LCC unit 20 of FIG. 1. The LCC 20 comprises a control logic (CL) portion 200, an oscillator counter (OC) 202, a reference clock counter (RCC) 204, a minimum count detector (MCD) 206, and a switch logic and output latches (SLOL) portion 208. Separate digital "on" or "off" output signals from the SLOL 208 are applied to the lead 22 (see also FIG. 1) which is shown here as having an upper, multiple conductor portion 210, and a lower multiple conductor portion 212. These digital signals are applied via their respective conductors in the lead 22 to the memory unit 24 and the MUX 26 (see FIG. 1) and thence via separate conductors in the lead 34 at the output of the MUX 26 to the bias unit 36. These digital signals from the SLOL 208 control the respective settings of the switches 106 and 108 of the current Stages I-1 through I-N of the bias unit 36, as was previously explained (see FIG. 3).

The CL portion 200 of the LCC 20 receives via the lead 18 signals from the ROSC 16, and receives via the lead 48 signals from a reference clock (not shown) applied to the terminal 46. With a "start" command (CNTR START applied to the terminal 55), the CL portion 200 applies via a lead 216 signals from the ROSC to the OC 202, and applies via a lead 218 signals from the reference clock to the RCC 204. Counters OC 202 and RCC 204 are identical and each provides a cumulative count of the number of cycles counted from the instant of starting of the respective ROSC and reference clock signals applied to the counters. By way of example, the counters 202 and 204 are 8-bit binary counters (well known in the art) able to count up to 256 time periods (cycles) of the oscillating signals applied to them. The output count of the OC 202 is applied via a multi-conductor common lead 220 to the MCD 206 and to the SLOL 208. The output count of the RCC 204 is applied via a multi-conductor common lead 222 to the MCD 206 and the SLOL 208. At "start" (when CNTR START is applied to terminal 55), each counter is initially set at the binary equivalent of decimal 255 and thereafter counts down to zero (minimum count). When either counter OC 202 or RCC 204 reaches or almost reaches "zero" count (the other counter will still have a non-zero count), this zero is detected by the MCD 206 which then via a lead 224 signals the CL 200 to "stop" input signals on the leads 216 and 218 to the respective counters OC 202 and RCC 204. The respective output counts of the OC 202 and the RCC 204 are thus "frozen" when the CL 200 receives a "stop" on zero count signal from the MCD 206. While the counters OC 202 and RCC 204 are counting, their respective binary output counts are being applied on-the-fly to the SLOL 208. The SLOL 208 continuously decodes the binary counts and applies on subsequent command from the CL 200 via the lead 230, when the counts are "frozen" a selected sequence of digital "on" or "off" output signals to respective conductors of the output lead 22.

On receipt of a "stop" signal to the CL 200 from the MCD 206 at "zero" count from one or the other counter OC 202 or RCC 204, both the zero and the non-zero count in the counters are "frozen" and decoded. Simultaneously, the CL 200 via a lead 230 signals the SLOL 208 to "latch" separate steady-state digital "on" or "off" signals onto the multi-conductor output lead 22. The sequence of these digital signals "on" and "off" corresponds to the decoded non-zero count in accordance with a predetermined algorithm, as will be explained hereinafter. If the residual non-zero count remains in the OC 202, the ROSC 16 has a frequency slower than that of the reference clock. If the non-zero count remains in the RCC 204, the ROSC 16 has a frequency faster than that of the reference clock. The SLOL 208 is thus able to tell from the "frozen" non-zero binary count on either the lead 220 or the lead 222 (the count on the other lead is zero) whether to apply a digital "on" signal or signals to a respective conductor or conductors in the upper portion 210 of the output lead 22, or to a respective conductor or conductors in the lower portion 212 of the lead 22. The above description of the LCC 20 gives an overview of its organization and mode of operation. A further explanation of the operation of the LCC 20 and specific details of its structure and organization will be given hereinafter.

Figure 5A:
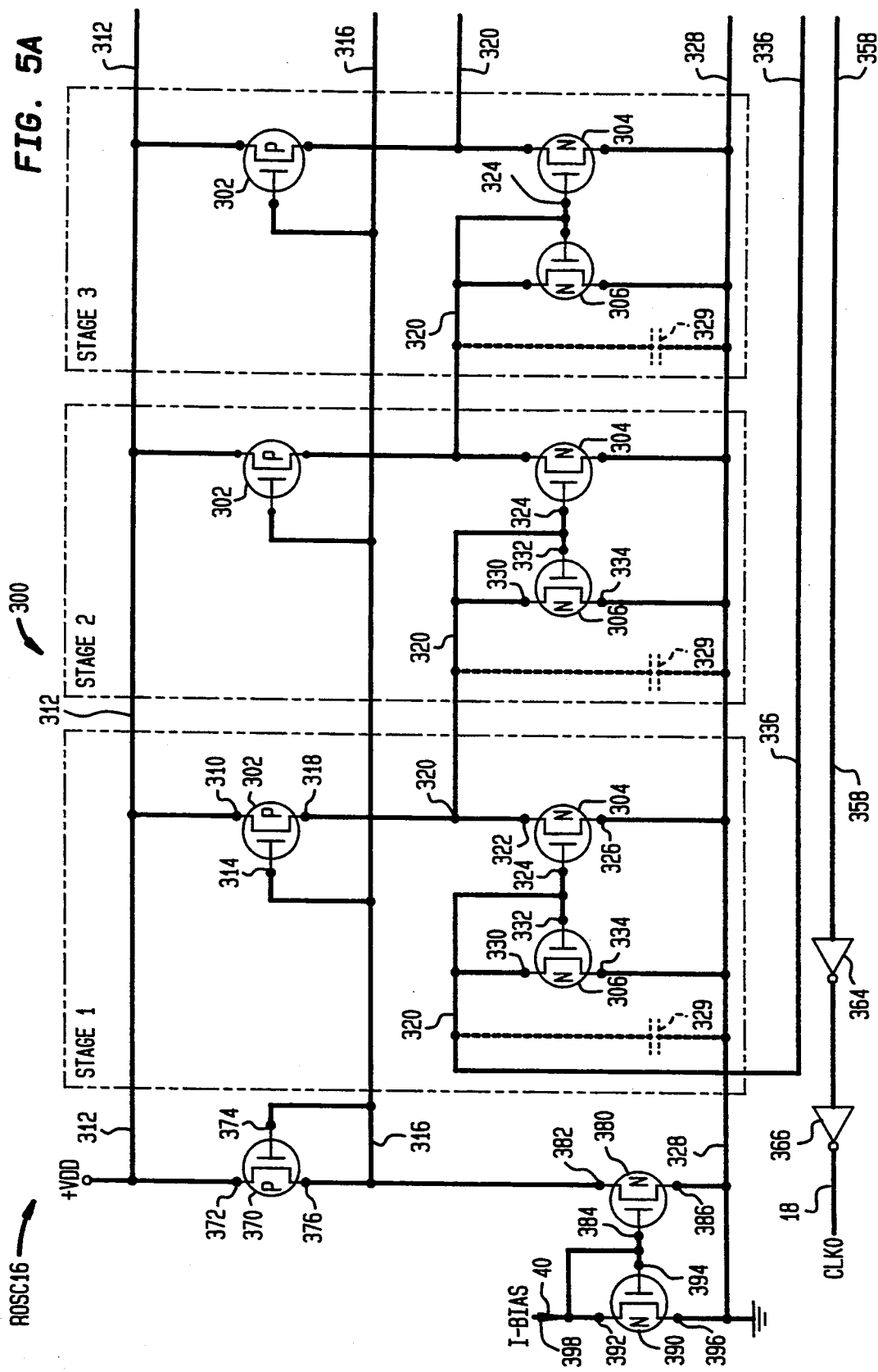

Referring now to FIGS. 5A and 5B, there is shown a specific circuit diagram of a preferred embodiment of the ROSC 16 of FIGS. 1 and 2. The ROSC 16 here comprises five substantially identical switching Stages "1" through "5" (an odd number of stages) shown within dashed line boxes 300. Each stage 300 here is equivalent to a switching stage 60 shown schematically in FIG. 2. Each stage 300, for example Stage 1, comprises a P-channel field effect transistor 302 connected in current series with an N-channel field effect transistor 304. An N-channel field effect transistor 306, with its drain and gate connected together so as to function as a diode, is coupled to the transistor 304 and is located within the same stage. The transistors 304 and 306 are connected in an N-channel current mirror arrangement, the operation of which is described hereinafter. Each of transistors 302, 304 and 306 has a drain, a source, and a gate. The drain and source may be denoted as first and second or second and first outputs of the transistor. Corresponding elements in each of the stages 300 have been given the same respective reference numbers.

The transistor 302 has a source electrode 310 connected to a common voltage bus 312 to which a supply voltage +VDD is applied. The transistor 302 has a gate electrode 314 connected to a control voltage bus 316, and has a drain electrode 318 connected to a terminal (node) 320. The transistor 304 has a drain electrode 322 connected to the terminal 320, has a gate electrode 324 connected to the terminal 320 of the immediately preceding (driving) stage, and has a source electrode 326 connected to a ground bus 328. The transistor 306 has a drain electrode 330 and a gate electrode 332 both connected to the terminal 320 of the driving (immediately preceding) stage and has a source electrode 334 connected to the ground bus 328. Transistor 306 is configured as a diode and as such serves to act as a voltage clamp which limits the voltage swing of terminal 320 of the preceding driving stage. This serves to reduce undesirable switching noise in oscillator system 12. Parasitic capacitance associated with transistors 302 and 304 of the driving stage, and transistors 306 and 304 of the following stage, is shown as a dashed line capacitor 329 which has a first plate coupled to terminal 320 of the driving stage and has a second plate coupled to ground bus 328. It is to be noted that the gate electrode 324 of the transistor 304 in Stage 2 is connected back to the terminal 320 of Stage 1, the gate electrode 324 of the transistor 304 in Stage 3 connected back to the terminal (node) 320 of Stage 2, and so on, to Stage 5. The terminal (node) 320 of Stage 5 is connected via a lead 336 to the gate 324 of the transistor 304 of Stage 1. Thus the five stages 300 of the ROSC 16 are connected in a "ring".

Shown at the right in FIG. 5B is a P-channel field effect transistor 346, having a drain electrode 348 connected to the voltage supply bus 312, having a gate electrode 350 connected to the voltage bus 316, and having a drain electrode 352. An N-channel field effect transistor 354 has a drain electrode 356 connected in common to the drain electrode 352 of the transistor 346 and to a lead 358, has a gate electrode 360 connected to the gate electrode 324 of the transistor 304 of Stage 5, and has a source electrode 362 connected to the ground bus 328. The lead 358 is connected to an input of a first amplifier-inverter 364 and coupled to an input of a second amplifier-inverter 366 whose output is coupled to the output lead 18 where the output signal CLKO of the ROSC 16 is obtained.

Shown at the left of FIG. 5A is a P-channel field effect transistor 370 which has a source electrode 372 connected to the voltage bus 312, and has a gate electrode 374 and a drain electrode 376 both connected to the voltage bus 316. An N-channel field effect transistor 380 has a drain electrode 382 connected in common to the drain electrode 376 of the transistor 370 and the voltage bus 316, has a gate electrode 384 connected to the I-bias current lead 40 (see FIG. 2) and has a source electrode 386 connected to the ground bus 328. An N-channel field effect transistor 390 has a drain electrode 392 and a gate electrode 394 both connected in common to the lead 40, and has a source electrode 396 connected to the ground bus 328.

The control current I-bias flows from the lead 40 in the direction of an arrow 398 through the transistor 390, which is diode-connected, and produces a control voltage on the gate 384 of the transistor 380 which in turn generates a current proportional to the control current I-bias flowing through the transistor 380 to ground. The current flowing through the transistor 380 from the transistor 370, which is diode-connected, produces in turn a voltage on the control voltage bus 316 which can be used to generate a current proportional to the I-bias current. This voltage is precisely controlled by the I-bias current. In effect, this arrangement transforms the I-bias control current into a corresponding control voltage on the voltage bus 316. The transistor 370 is connected with the transistors 302 of the stages 300 in a current mirror arrangement (well known in the art) to produce respective currents in the transistors 302 of the stages 300 proportional to the current through the transistor 370. The control voltage on the voltage bus 316 is determined by the current through the transistor 370 which is proportional to the I-bias current and in turn controls the respective currents through the transistors 302. By way of example, the current through the transistor 370 may be set to equal the I-bias current by the current mirror comprised of the N-channel transistors 390 and 380, and the respective currents through the transistors 302 of the stages 300 may each be made equal to the current through the transistor 370.

As was explained in connection with FIG. 2, the current available from the generator 62 to charge the load capacitor 70 of a stage 60 when its respective switch 66 is opened determines the time required to charge the capacitor 70 to full value. The discharging current when the switch 66 is closed is also proportional to the current available from the generator 62 (through the action of the N-channel current mirror transistors 306 and 304), and determines the discharging time. In FIGS. 5A and 5B no capacitor per se is shown and it is to be understood that the equivalent of the capacitor 70 (FIG. 2) is the interelectrode capacity from the terminal (node) 320 to ground for each stage 300. The transistors 304 of the stages 300 of FIGS. 5A and 5B correspond to the switches 66 (FIG. 2) and the transistors 306 of FIGS. 5A and 5B correspond to the impedances 78 (FIG. 2). The transistor 302 of each stage 300 of FIGS. 5A and 5B corresponds to the current generator 62 (FIG. 2). The respective current available from the transistor 302 of each stage 300 is controlled by the I-bias current through the voltage on the control voltage bus 316.

In a preferred embodiment, the size of the transistor 306 is made half that of the transistor 304 so that the transistor 304, when on, will want to conduct a current equal to twice that of transistor 306. The current through the transistor 306 is equal to the current in transistor 302 of the preceding stage. Thus when the transistor 304 switches on, it will take all of the current from the transistor 302 and more, which helps to quickly pull the potential on the node 320 down nearly to zero (ground potential). This discharges capacitor 329 and results in a digital "0" being stored in that particular stage 300. When the transistor 304 switches off, controlled current from the transistor 302 will in a short time charge the load capacitances (capacitor 329) of this stage 300 to a potential representing a digital "1". This potential is clamped to a relatively low value (typically only slightly larger than the threshold voltage of an N-channel device) by the diode-connected transistor 306. The charging and discharging times of the interelectrode capacitances (i.e., capacitor 329) are functions of the amplitude of the current supplied by the transistor 302, as was explained previously.

It will be seen from the circuit of the ROSC 16 shown in FIGS. 5A and 5B that when the transistor 304 of Stage 1 of the stages 300 switches "on", the respective voltage of voltage node 320 is pulled down to near ground potential (digital "0") in a controlled time. This in turn pulls the gates 324 and 332 of the transistors 304 and 306 of the next stage 300, Stage 2, to near ground potential and causes the transistor 304 of Stage 2 to turn "off". When this occurs, the terminal 320 (and its interelectrode capacitances) of Stage 2 are then (in a controlled time) charged to a high level (a digital "1") by the transistor 302 of Stage 2. The stages 300 may be termed current steering inverters. The ROSC 16 and its associated bias unit 36 operate in accordance with current-steering logic The switching from "1" to "0" and "0" to "1" in turn from one stage 300 to the next stage 300 of the ROSC 16 is continuous, though each stage 300 is bi-stable. The time required for a switching event to progress from one stage to the next (which is controllable) and the number of stages (which is predetermined) determine the frequency of operation of the ROSC 16. The function of P-channel transistor 346 and N-channel transistor 354 is to transform the current-steering logic digital levels into regular CMOS logic digital levels. This is achieved by suitably setting the sizes of these transistors with respect to each other.

Referring now to FIGS. 6A and 6B, there is shown a preferred embodiment of the bias unit 36 of FIG. 3. The bias unit 36 of FIGS. 6A and 6B comprises eight current-supply stage "I-1" through "I-8", each stage being shown within a dashed line box generally indicated at 400. The stages 400 are substantially identical with each other, and corresponding elements within each stage have been given respective reference numbers. Each stage 400, Stage I-1 for example, has a P-channel field effect transistor 402, a first N-channel field effect switch transistor 404, a second N-channel field effect switch transistor 406 and an N-channel field effect transistor 408. The transistor 402 has a source electrode 410 connected to a common supply voltage (+VDD) bus 411, has a gate electrode 412 connected to a common control voltage bus 414, and has a drain electrode 416. The transistor 404 has a drain electrode 418 connected to the drain electrode 416 of the transistor 402, has a gate electrode 420 connected to an input control terminal "P-1", and has a source electrode 422 connected to a common output current bus 424. The transistor 406 has a drain electrode 426 connected to the output current bus 424, has a gate electrode 428 connected to an input control terminal "M-1", and has a source electrode 430 connected to a drain electrode 432 of the transistor 408. The transistor 408 has a gate electrode 434 connected to a common control voltage bus 436, and has a source electrode 438 connected to a common ground bus 440. It is noted that the input terminals "P-1" and "M-1" are respective only to Stage I-1; terminals "P-2" and "M-2" apply to Stage I-2, and so on, to terminals "P-8" and "M-8" for Stage I-8. Steady state digital "on" or "off" control voltage signals are applied to respective ones of the terminals P-1 through P-8 and M-1 through M-8, as will be explained hereinafter, to set the level of the current I-bias.

To the left in FIG. 6A are a P-channel field effect transistor 442, a P-channel field effect transistor 444, a P-channel field effect transistor 446 and an N-channel field effect transistor 448. The transistor 442 has a source electrode 450 connected to the supply voltage bus 411, and has a gate electrode 452 and a drain electrode 454 connected to the common lead 130 (also see FIGS. 1 and 3) which has a terminal 132 connected thereto. During operation of oscillator system 12 a current I-OSC is established in bias unit 36 of FIGS. 6A and 6B which flows via lead 130 into terminal 132. A constant current source (not shown) is coupled to terminal 132 and is typically a band gap current generator which generates a constant current level substantially independent of power supply and temperature variations over useful ranges. The transistor 444 has a source electrode 458 connected to a supply voltage (+VDD) terminal 460, has a gate electrode 462 connected to the common lead 130, and has a drain electrode 464 connected to the output current bus 424. During operation of bias unit 36 of FIGS. 6A and 6B a current I-O flows through lead 570 and forms part of I-bias shown flowing in lead 40. The transistor 446 has a source electrode 466 connected to a voltage supply (+VDD) terminal 468, has a gate electrode 470 connected to the common lead 130, and has a drain electrode 472 connected to a drain electrode 474 of the transistor 448. The transistor 448 has a gate electrode 476 connected to its drain electrode 474, and has a source electrode 478 connected to a ground terminal 479. This same voltage +VDD can be connected to the bus 411 and the terminals 460 and 468.

To the right of the transistor 442, which is diode-connected, is a current-divider current-mirror arrangement, generally indicated within a dashed line box 480. This arrangement 480 comprises four transistors: a P-channel field effect transistors 482, an N-channel field effect transistor 484, a P-channel field effect transistor 486, and an N-channel field effect transistor 488. To the right of the N-channel transistor 448 is a similar (but not identical) current-divider current-mirror arrangement shown within a dashed line box 490. The arrangement 490 comprises four transistors: P-channel field effect transistors 492 and 496, and N-channel field effect transistors 494 and 498.

The transistor 482 of the arrangement 480 has a source electrode 502 connected to the supply voltage bus 411, has a gate electrode 504 connected to a lead 130, and has a drain electrode 506 connected to a drain electrode 508 of the transistor 484. The transistor 484 has a gate electrode 510 connected to the drain electrode 508, and has a source electrode 512 connected to a ground bus 514. The transistor 486 has a source electrode 516 connected to the supply voltage bus 411, and has a gate electrode 518 and a drain electrode 520 both connected to the voltage bus 414. The transistor 488 has a drain electrode 522 connected in common to the drain electrode 520 of the transistor 486 and to the voltage bus 414, has a gate electrode 521 connected in common to the gate 510 and the drain 508 of the transistor 484, and has a source electrode 526 connected to the ground bus 514.

The transistor 492 of the arrangement 490 has a source electrode 530 connected to a supply voltage (+VDD) bus 532, and has a gate electrode 534 and a drain electrode 536 both connected in common with a drain electrode 538 of the transistor 494. The transistor 494 has a gate electrode 540 connected in common with both the drain electrode 474 and the gate electrode 476 of the transistor 448, and has a source electrode 542 connected to a ground bus 544. The transistor 496 has a source electrode 546 connected to the voltage supply bus 532, has a gate electrode 548 connected in common with both the gate electrode 534 and the drain electrode 536 of the transistor 492, and has a drain electrode 550 connected in common with a drain electrode 552 of the transistor 498 and the voltage bus 436. The transistor 498 has a gate electrode 554 connected to the drain electrode 552, and has a source electrode 556 connected to the ground bus 544.

The output current bus 424 of the bias unit 36 is connected at the left to a terminal 560 to which the lead 40 (I-bias) is connected. Current flows to the terminal 560 in the direction indicated by an arrow 562. The common lead 130 is connected to the terminal 132 to which the current "I-OSC" is applied. Current flows to the terminal 132 in the direction of an arrow 566.

As mentioned previously, the current "I-OSC" is stable with respect to supply voltage and temperature variations. The flow of this current "I-OSC" through the transistor 442 establishes on the common lead 130 a stable voltage which can be used to generate a current proportional to the current "I-OSC". The common lead 130 is connected to the gate 504 of the transistor 482 which forms part of the current-divider current-mirror arrangement 480. The voltage on the lead 130 generates a current proportional to the current I-OSC which flows in series through the transistor 482 and the transistor 484 which is diode-connected and serves as a current source. The current through the transistor 488 is controlled by its gate electrode 521 which is connected in common with the drains 506 and 508 of the transistors 482 and 484, respectively, and is proportional to the current I-OSC. The transistor 488 is connected in series with the transistor 486 which is diode-connected as a current source. The transistor 486 is connected via the voltage bus 414 in a current-mirror arrangement with the respective transistors 402 of the Stages I-1 through I-8. The sizes of the transistors 482, 484, 486 and 488 of the arrangement 480 and the sizes of the transistors 402 are ratioed to the size of the transistor 442 such that the amplitude of the current provided by each of the transistors 402 is a predetermined small fraction of the amplitude of the current "I-OSC". This will be explained further hereinafter.

The voltage on the lead 130, which lead is connected to the gate 462 of the transistor 444, controls the current through the transistor 444. This current, which is designated "I-0", flows in the direction of an arrow 570 into the control current bus 424. The size of the transistor 444 with respect to that of the transistor 442 is such that, for example, the amplitude of "I-0" equals that of "I-OSC".

The voltage on the lead 130, which is connected to the gate 470 of the transistor 446, generates a current which is proportional to the current I-OSC and which flows through this transistor 446 and the transistor 448, which is diode-connected in series with it. These transistors control in accordance with the current "I-OSC", the operation of the current-divider current-mirror arrangement 490. The gate electrode 540 of the transistor 494 is connected to the common connection of the drain electrodes 472 and 474 of the transistors 446 and 448. The transistor 494 is connected in series with the transistor 492, which is diode-connected, and the current through them is proportional to the current I-OSC. The respective drain electrodes 536 and 538 of the transistors 492 and 494 are connected in common with the gate electrodes 548 and 534 of the transistors 496 and 492, respectively. The bias level of the gate electrode 548 is used to generate a current through the transistor 496 which is proportional to the current through the diode-connected transistor 492, which current also flows through the transistor 498. The transistor 498 is diode-connected as a current source and forms through the control voltage bus 436 a current mirror for the respective transistors 408 of the Stages I-1 through I-8. The respective current produced by each of the transistors 408 is a predetermined small fraction of the current I-OSC. The amplitudes of the separate currents through the respective transistors 402 and 408 are determined by criteria to be explained hereinafter. These separate currents incrementally add to or subtract from the current "I-0" on the bias current output lead 424 (and the lead 40) to produce a net current "I-bias", as was explained previously (FIG. 3).

Table I shown below is provided to show relationships amongst values of oscillator time period (Tpo) in nanoseconds (nsec), frequency (fo) in Mega Hertz (MHz) of the ROSC 16, and current I-bias in micro amperes (uA). In a typical illustrative embodiment the high voltage +VDD=+3.3 volts, temperature=55° C., Tpo=33.998 nsec, and I-bias=32.4560896 uA. These values are obtained by computer simulation in accordance with techniques well known in the art, and with criteria for the oscillator system 12 given herein.

TABLE I

| Row | Oscillator Time Period Tpo(nsec) | Frequency fo(MHz) | I-bias Current I-bias(uA) |
|---|---|---|---|
| | a) To speed up the oscillator: | | |
| 1 | 31.504(−7.34%) | 31.742(7.92%) | 35.8516165(10.5%) |
| 2 | 29.415(−13.48%) | 33.996(15.58%) | 39.2455937(20.9%) |
| 3 | 27.637(−18.71%) | 36.183(23.02%) | 42.6380951(31.4%) |
| 4 | 26.105(−23.22%) | 38.307(30.24%) | 46.0291794(41.8%) |
| 5 | 24.768(−27.15%) | 40.375(37.27%) | 49.4188934(52.2%) |
| 6 | 23.592(−30.61%) | 42.387(44.11%) | 52.8072745(62.7%) |
| 7 | 22.546(−33.68%) | 44.354(50.80%) | 56.1943526(73.1%) |
| 8 | 21.611(−36.43%) | 46.273(57.32%) | 59.5801614(83.5%) |

TABLE I-continued

| Row | Oscillator Time Period Tpo(nsec) | Frequency fo(MHz) | I-bias Current I-bias(uA) |
|---|---|---|---|
| | b) To slow down the oscillator: | | |
| 1 | 36.220(6.54%) | 27.609(−6.13%) | 29.9029605(−7.9%) |
| 2 | 38.826(14.2%) | 25.756(−12.43%) | 27.3515796(−15.7%) |
| 3 | 41.928(23.32%) | 23.850(−18.91%) | 24.8021466(−23.6%) |
| 4 | 45.687(34.38%) | 21.889(−25.68%) | 22.2549163(−31.4%) |
| 5 | 50.343(48.08%) | 19.864(−32.47%) | 19.7102331(−39.3%) |
| 6 | 56.264(65.49%) | 17.773(−39.57%) | 17.1685200(−47.1%) |
| 7 | 64.061(88.43%) | 15.610(−46.93%) | 14.6304464(−54.9%) |
| 8 | 74.812(120%) | 13.367(−54.55%) | 12.0969561(−62.7%) |

Table I shows in part a) the relationships of Tpo, fo, and I-bias as the oscillator is sped up, and in part b) shows these relationships as the oscillator is slowed down. As seen in part a), row 8, for an I-bias current of about 59.58 uA, the fo is about 46.27 MHz, or 57.32% greater than the nominal fo of 29.41 MHz. The I-bias current in row 8 of about 59.58 uA is 83.5% greater than the nominal I-bias current and a Tpo of about 21.6 nsec is −36.43% less than the nominal Tpo. Similarly, as seen in row 8 of part b), for an I-bias current of about 12 uA (−62.7% less than the nominal I-bias current) there is an fo of 13.367 MHz (−54.55% less than the nominal fo) and a Tpo of 74.812 nsec (120% greater than the nominal Tpo).

It will be noted that the range over which the frequency fo can be adjusted as given in Table I extends from +57.32% (row 8, part a) to −54.55% (row 8, part b) relative to the nominal frequency fo of about 29.41 MHz by varying I-bias. Thus, the range of adjustment for the frequency fo of any given oscillator out of a production group of them is about ±50%. This range will adequately cover the adjustments needed by a population of oscillators having unadjusted frequencies lying somewhat on either side of an intended nominal frequency of about 29.41 MHz, the respective adjustment for each oscillator bringing its operating frequency to within a few percent of the nominal frequency (as measured against a reference clock).

It should also be noted that the range of the current I-bias in part a) of Table I extends from the nominal value (about 32.45 uA) to +83.5% greater than nominal (row 8). For the sake of convenience, since there are eight current stages 400 employed (FIGS. 6A and 6B), each increasing increment of current I-bias as shown in rows 1-8, has been made equal to about 10.5% (83.5%/8) of the nominal value of I-bias. Similarly, as seen in part b), each negative increment of current I-bias is made equal to about −7.9% (−62.7%/8) of the nominal value. Thus the negative incremental steps, rows 1-8 in part b), are approximately equal to each other (i.e., each about 2.5 uA). Positive incremental steps in the current I-bias, shown in rows 1-8 of part a), are also approximately equal to each other (i.e., each about 3.4 uA), but have a slightly larger value than the negative incremental steps in part b).

Table II below shows in part a) relationships of various values of actual oscillator time period Tpo (vs. nominal time period) corresponding to a respective remaining count in the oscillator counter, and in part b) a respective remaining count in the reference clock counter, together with needed percentage adjustments to the actual frequency fo of the ROSC 16. Table II illustrates an algorithm for utilizing remaining counts in making adjustments in the value of current I-bias.

TABLE II

Remaining Count Detection and Algorithm a) To speed up the oscillator frequency when it is below a preselected nominal value:

| Row | Actual Tpo (vs. nominal) | Remaining count in oscillator counter | Needed fo Adjustment |
|---|---|---|---|
| 1 | +7.92% | 18 = 16 + 2 | +7.992% |
| 2 | +15.58% | 34 = 32 + 2 | +15.58% |
| 3 | +23.02% | 47 = 32 + 8 + 4 + 2 + 1 | +23.02% |
| 4 | +30.24% | 59 = 32 + 16 + 8 + 2 + 1 | +30.24% |
| 5 | +37.27% | 69 = 64 + 4 + 1 | +37.27% |
| 6 | +44.11% | 78 = 64 + 8 + 4 + 2 | +44.11% |
| 7 | +50.80% | 85 = 64 + 16 + 4 + 1 | +50.80% |
| 8 | +57.32% | 92 = 64 + 16 + 8 + 4 | +57.32% | b) To slow down the oscillator frequency when it is above a preselected nominal value:

| Row | Actual Tpo (vs. nominal) | Remaining count in reference clock counter | Needed fo Adjustment |
|---|---|---|---|
| 1 | −6.13% | 16 = 16 | −6.13% |
| 2 | −12.43% | 31 = 16 + 8 + 4 + 2 + 1 | −12.43% |
| 3 | −18.91% | 48 = 32 + 16 | −18.91% |
| 4 | −25.68% | 65 = 64 + 1 | −25.68% |
| 5 | −32.47% | 82 = 64 + 16 + 2 | −32.47% |
| 6 | −39.57% | 100 = 64 + 32 + 4 | −39.57% |
| 7 | −46.93% | 119 = 64 + 32 + 16 + 4 + 2 + 1 | −46.93% |
| 8 | −54.55% | 139 = 128 + 8 + 2 + 1 | −54.55% |

Table II in part a) shows in rows 1-8 respective percentage differences of Tpo (vs. the nominal value of 33.998 nsec.) as the oscillator system 12 runs slower and slower. It will be remembered that when the oscillator system 12 runs slow relative to the reference clock (see FIG. 4) there will be a count remaining in the oscillator counter 202 when the reference clock counter 204 reaches zero or a preset minimum count close to zero. Based on the selected values of Tpo in rows 1-8 of part a) of Table II, the corresponding remaining counts in the oscillator counter 202 are given in the respective rows 1-8. For example, with both counters being 8-bit down-counters and being initially loaded with the maximum count of 255, a +7.92% Tpo shown in row 1 results in a remaining count of "18". This is calculated as follows: Remaining count=-[1−1/(1.0792)]×255=18 (rounded to a whole integer). A 57.32% Tpo shown in row 8 results in a remaining count of [1-1/(1.5732)]×255=92 (rounded off). The oscillator counter here is the oscillator counter (OC) 202 (FIG. 4). Its 8 binary bits may be considered as follows:

| bit position | 1st, | 2nd, | 3rd, | 4th, | 5th, | 6th, | 7th, | 8th |
|---|---|---|---|---|---|---|---|---|
| weighted decimal value | 1 | 2 | 4 | 8 | 16 | 32 | 64 | 128 |

A set bit in each of the eight positions results in a decimal count of "255". The count of "18" of row 1 part a) is represented by a bit in the 5th position (a weighted decimal value of 16) plus a bit in the 2nd position (a weighted decimal value of 2) or 16+2=18. Similarly, the Tpo of +57.32% shown in row 8 results in a remaining count of "92" (rounded off) which is represented by 64 (7th bit)+16 (5th bit)+8 (4th bit)+4 (3rd bit).

In similar fashion, part b) of Table II shows in rows 1-8 the respective remaining counts in the reference clock counter (RCC) 204 when the oscillator is running faster and faster. Thus in row 1, the Tpo is −6.13% and the remaining count is 16 (rounded off) as calculated by (0.0613)×255=16. Similarly in row 8, for a Tpo of −54.55% the remaining count is (0.5455)× 255=139 (rounded off). The weighted binary values of these respective counts are as indicated (e.g., row 8, 139=128+8+2+1).

Figure 6:
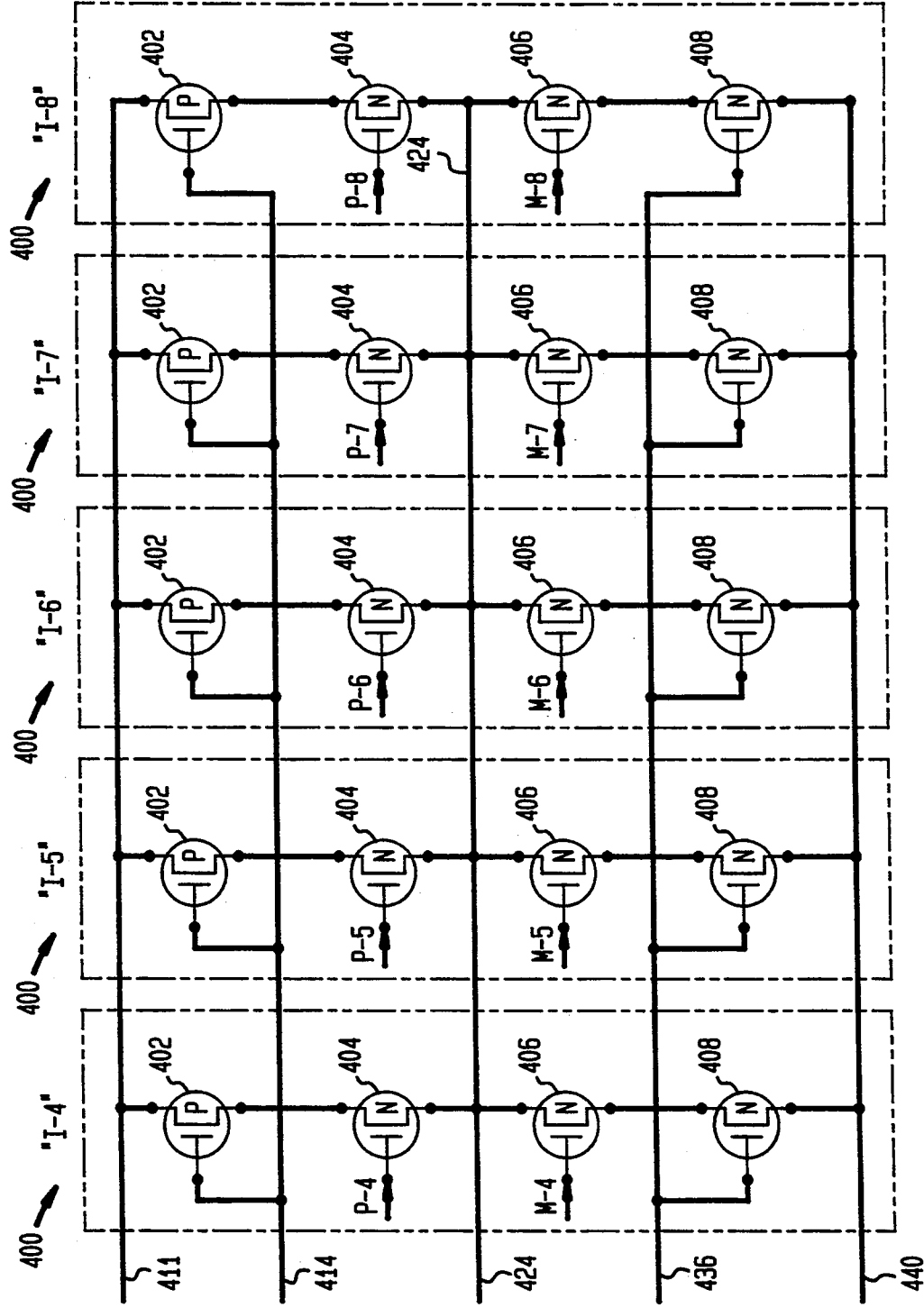
FIG. 6 shows how
Figure 6:
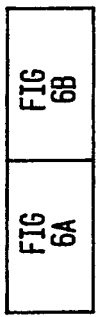

An algorithm used herein for determining when successive current stages of the bias unit 36 are turned on, thus respectively adding to or subtracting from the nominal I-bias current, may be stated as follows. The 1st and 2nd bits of an 8-bit remaining binary count are ignored because they add little to increased accuracy. For the oscillator running slow as in part a) of Table II, no current stage 400 (FIG. 6) is turned on to add an incremental amount of current to the nominal I-bias until the remaining count reaches "18" (row 1). Since the second bit is ignored, the actual target count here is reduced to "16". When the count reaches 16, the transistor 404 in one stage 400 in the bias unit 36 (FIGS. 6A and 6B) is turned on and adds about +10.5% to the nominal value of I-bias to give an I-bias of about 35.85 uA to increase the oscillation frequency fo by +7.92% (as shown in row 1, part a, of Table I). When the remaining count in part a) of Table II reaches "34" or 32 in actuality since the 2nd bit is ignored (row 2), the transistor 404 in a second stage 400 is turned on, and so on in eight steps in accordance with the respective remaining counts in rows 1–8. The resulting adjustments in frequency fo, as indicated in rows 1–8, range from +7.92% to +57.32%.

Where the oscillator is running fast and when the remaining count in the reference clock counter reaches "16", as shown in row 1, part b) of Table II, the transistor 406 in one current stage 400 is turned on. This, as seen in row 1, part b) of Table I, subtracts an increment of −7.9% from the nominal I-bias current to give an adjusted I-bias current of about 29.9 uA to decrease the oscillation frequency fo by −6.13%. The transistors 404 in additional stages 400 are turned on from only one stage at count 16 of row 1, part b, Table II, two stages at count 31 or 28 in actuality since the 1st and 2nd bits are ignored (row 2), three at count 48 (row 3), and so on, until all eight stages 400 are on at count 139 or 136 in actuality since the 1st and 2nd bits are ignored (row 8). The resulting adjustments in frequency fo, indicated in rows 1–8, range from −6.13% to −54.55%. It will be further explained hereinafter how the respective binary bits in a remaining count in one or the other of the respective counters OC 202 and RCC 204 are applied to the SLOL 208 (FIG. 4) to generate steady-state digital "on" and "off" signals for controlling the respective current stages 400 of the bias unit 36 (FIG. 6). These steady-state control signals are applied respectively to the terminals "P-1" through "P-8" and "M-1" through "M-8" of the bias unit 36 as was previously explained.

Figure 7:
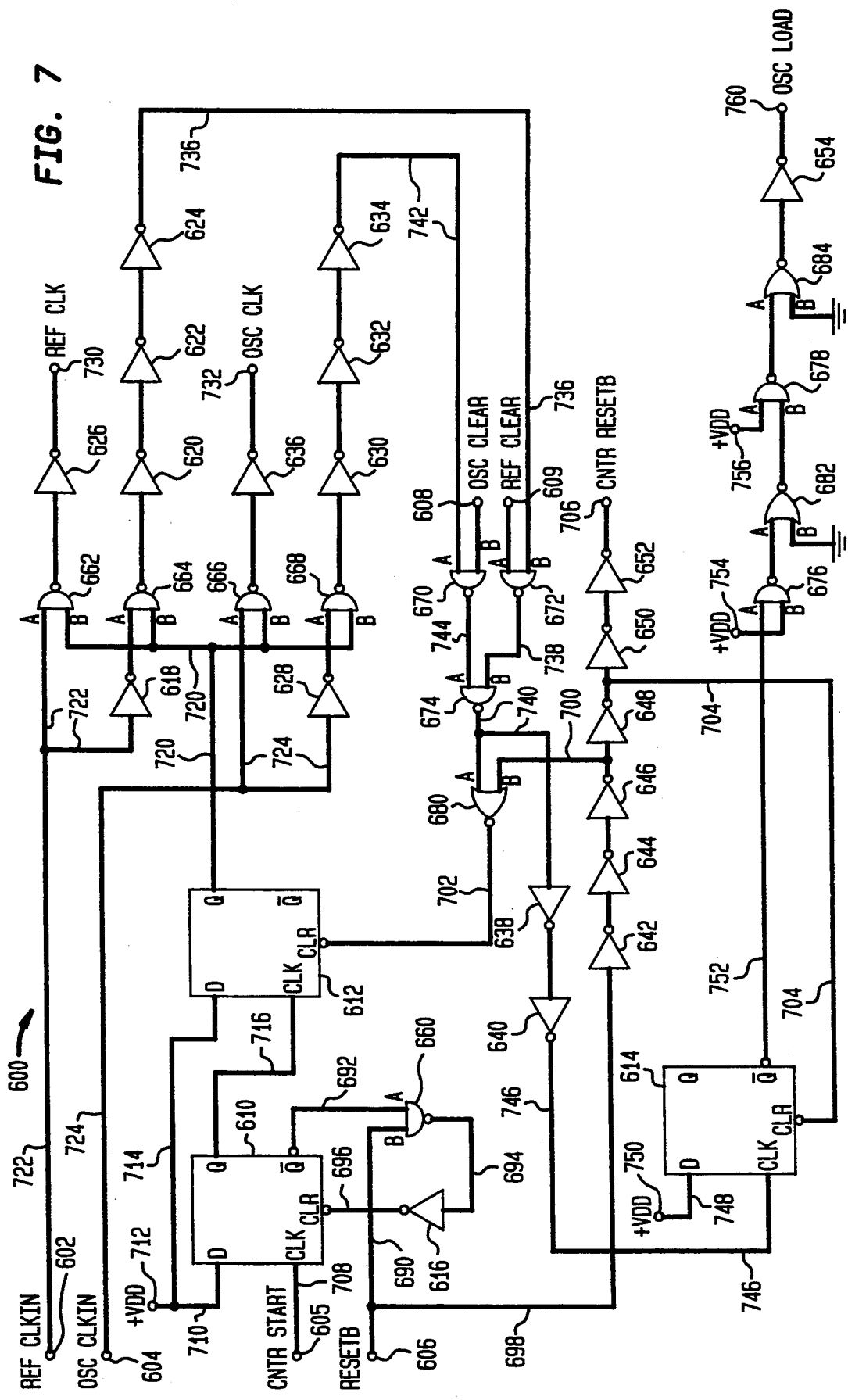
FIG. 7 shows a detailed diagram of a logic circuit useful for performing the functions of a control logic unit and a minimum count detector of FIG. 4.

Referring now to FIG. 7, there is shown a detailed diagram of a logic circuit 600. The logic circuit 600 is useful to perform the functions of the control logic (CL) unit 200 and the minimum count detector (MCD) 206 both shown in FIG. 4. The logic unit 600 at the left has a terminal 602 (REF CLKIN) to which the reference clock lead 48 (see FIG. 4) is connected, and a terminal 604 (OSC CLKIN) to which the lead 18 from the ROSC 16 is connected. The logic unit 600 has a terminal 605 to which a positive-going operation start signal (CNTR START) is applied, and a terminal 606 to which a negative-going reset signal (RESETB) is applied. The logic circuit 600, as seen near the center of FIG. 7, has a terminal 608 to which an oscillator counter clear signal (OSC CLEAR) is applied, and a terminal 609 to which a reference clock counter clear signal (REF CLEAR) is applied. The logic circuit 600 comprises three "D" flip-flop latches 610, 612 and 614. These latches are well known in the art and each has terminals designated in conventional fashion as "D", "Q", "Qbar", "CLR" and "CLK". The logic circuit 600 further comprises inverters 616, 618, 620, 622, 624, 626, 628, 630, 632, 634, 636, 638, 640, 642, 644, 646, 648, 650, 652, and 654 and NAND gates 660, 662, 664, 666, 668, 670, 672, 674, 676, and 678. These NAND gates are well known in the art and each has an input A, an input B, and an output which goes low only when both inputs A and B go high. The logic circuit 600 further comprises NOR gates 680, 682 and 684. These NOR gates are well known in the art, and each has an A input, a B input, and an output which goes low when either input A or B goes high.

When a negative-going reset signal from a source (not shown) is applied to the terminal 606 (RESETB) the logic circuit 600 is "initialized", that is, the circuit 600 is made ready for operation. This negative-going signal at the terminal 606 is applied via a lead 690 to the "B" input of the NAND gate 660 and this results in the output of the NAND gate 660 going high regardless of whether input A, which is connected via a lead 692 to the "Qbar" terminal of the latch 610, is high or low. The output of the NAND gate 660 is connected via a lead 694 to the input of the inverter 616 whose output is connected via a lead 696 to the clear (CLR) terminal of the latch 610. When the output of the NAND gate 660 goes high, the output of the inverter 616 goes low. This resets the latch 610 to an initial state with its Q output low. Similarly the reset signal at the terminal 606 is applied via a lead 698 to the input of the inverter 642 connected in series with the inverters 644 and 646. Thus when the input of the inverter 642 goes low, after a short delay the input to the inverter 644 goes high and the input to the inverter 646 goes low and its output goes high. The output of the inverter 646 is connected to the input of the inverter 648 and via a lead 700 to the "B" input of the NOR gate 680. When the input B of the NOR gate 680 goes high, its output goes low and applies this level via a lead 702 to the CLR terminal of the latch 612. When its CLR terminal is pulled low, the latch 612 is reset to an initial state with its Q output low. This forces REF CLK terminal 730 and OSC CLK terminal 732 low no matter what state REF CLKIN terminal 602 and OSC CLKIN terminal 604 are in, thus disabling the counting operation.

When the input to the inverter 648 goes high, its output goes low and this, via a lead 704 pulls the CLR terminal of the latch 614 low thereby resetting the latch 614 forcing its Qbar output high, resulting in OSC LOAD terminal 760 going low. When the output of the inverter 648 goes low so does the input of the inverter 650 whose output goes high and pulls high the input of the inverter 652 high so that its output goes low. The output of the inverter 652 is connected to a terminal 706 (CNTR RESETB) to apply (via a lead not shown) a negative-going signal for resetting respective-initial conditions in the oscillator counter (OC) 202 of FIG. 4 and in the reference clock counter (RCC) 204 of FIG. 4.

By way of example, each counter is reset to a count of "255".

After the logic circuit 600 and the counters OC 202 and RCC 204 have been reset, a positive-going start signal (from a source not shown) is applied to the terminal 605 (CNTR START). This signal is applied via a lead 708 to the clock (CLK) terminal of the latch 610 and enables the latch 610. When this occurs, the signal level of the latch 610 at its output terminal "Q" becomes substantially the same as the signal level at the input terminal "D"; in effect the output "Q" is "latched" to the input "D". The input terminal "D" of the latch 610 is connected via a lead 710 to a terminal 712 to which supply voltage +VDD is applied. Similarly, the input terminal "D" of the latch 612 is connected via a lead 714 to the terminal 712, and the clock (CLK) terminal of the latch 610 is connected via a lead 716 to the "Q" terminal of the latch 610. When the latch 610 is enabled by a start signal, a positive going signal on the lead 716 to the CLK terminal of the latch 612 enables the latch 612 and transfers the potential at its terminal "D" to its terminal "Q". Thereafter, a steady-state positive signal is applied to the output terminal "Q" of the latch 612 (even though the latch 610 subsequently resets itself through its output terminal "Qbar", the NAND gate 660, and the inverter 616).

The output terminal "Q" of the latch 612 is connected via a common lead 720 to the "B" input of the NAND gates 662, 664, 666 and 668. These "B" inputs are held high when the latch 612 is enabled thereby holding the common lead 720 high.

The oscillating signal at the terminal 602 (REF CLKIN) is connected via a common lead 722 to the "A" input of the NAND gate 662 and to the input of the inverter 618 whose output is connected to the "A" input of the NAND gate 664. With the common lead 720 held high (latch 612 enabled) when the oscillating signal at the terminal 602 goes high, both inputs A and B of the NAND gate 662 are high and its output goes low; when the oscillating signal at input A goes low, the output of the NAND gate 662 goes high, thereby producing an inverted oscillating signal. This inverted signal at the output of the NAND gate 662 is re-inverted by the inverter 626 and applied to a terminal (REF CLK) 730 as an output oscillating signal in phase with the input signal at the terminal 602. The output oscillating signal at the terminal 730 (REF CLK) is applied via the lead 218 (see FIG. 4) to the RCC 204 which begins to count down from "255" the number of periods of oscillation of the reference clock, as was previously explained. In similar fashion and at the same time, the oscillating signal at the terminal 604 (OSC CLKIN) is applied via the lead 724, through the NAND gate 666 and the inverter 636 to an output terminal 732 (OSC CLK). The output signal at the terminal 732 is applied via the lead 216 (FIG. 4) to the OC 202 which likewise begins to count down from "255" the number of time periods of the ROSC 16.

When the count in either counter OC 202 or RCC 204 reaches zero or a preset minimum count close to zero, that counter with the minimum count applies a positive-going signal to a respective one of the terminals 608 (OSC CLEAR) or 609 (REF CLEAR). This positive-going signal pulls high either the "B" input of the NAND gate 670, or the "A" input of the NAND gate 672. While both counters are counting however, OSC CLEAR terminal 608 and REF CLEAR terminal 609 are both low and the outputs of the NAND gates 670 and 672 are both high. Assume for example that the ROSC 16 is running slow (relative to the reference clock) and that the RCC 204 has counted down to zero. The RCC 204 then applies a positive-going signal to the terminal 609 (REF CLEAR) and pulls high the "A" input of the NAND gate 672. If the counters being used are positive-edge triggered, REF CLEAR terminal 609 changes state from Low to High on the positive edge of REF CLKIN at terminal 602 and REF CLK at terminal 730. The "B" input of the NAND gate 670 remains low because the OC 202 has a non-zero count and the output of the NAND gate 670 remains high.

The "B" input of the NAND gate 672 is connected via a lead 736 to the output of the inverter 624. After a suitable delay and with a number of phase inversions through the inverter 618, the NAND gate 664, and the inverters 620, 622 and 624, a "low" level of the signal of the reference clock oscillations applied to the terminal 602 (REF CLOCKIN) becomes a "high" on the lead 736. This high applied to the "B" input of the NAND gate 672 along with a high (minimum count detected) on its "A" input results in a low at the output of the NAND gate 672. This happens half a clock period after REF CLEAR has switched from low to high on the positive edge of REF CLKIN and REF CLK and allows time for all counter logic to propagate and settle. This via a lead 738 pulls low the B input of the NAND gate 674 and causes the output thereof to go high, the output of the NAND gate 674 being low while both of its inputs A and B are held high. The output of the NAND gate 674 is connected via a common lead 740 to the input of the inverter 638 and to the "A" input of the NOR gate 680. Thus, when the common lead 740 is pulled high, the output of the NOR gate 680 goes low and via the lead 702 resets the latch 612. When this happens the level on the common lead 720 connected to the "Q" output of the latch 612 goes from high to low and this in turn disables oscillating signals REF CLKIN and OSC CLKIN from passing through the NAND gates 662, 664, 666 and 668. And the remaining count, in this example in the OC 202, is frozen at whatever value it then has as REF CLK and OSC CLK are returned low and held low by the low output Q of the latch 612.

If instead a minimum count signal had been received from the OC 202 (the ROSC 16 is running faster than the reference clock), the terminal 608 (OSC CLEAR) would go high and pull the "B" input of the NAND gate 670 high. The "A" input of the NAND gate 670 is connected via a lead 742 to the output of the inverter 634. Thus a "low" of the oscillator signal at the terminal 604 (OSC CLKIN) is transmitted with phase changes and delay through the inverter 628, the NAND gate 668, and the inverters 630, 632, and 634 to the lead 742 where the level is high when the input level at the terminal 604 (OSC CLKIN) is low. When both inputs A and B of the NAND gate 670 go high which happens half a clock period after OSC CLEAR has switched from low to high on the positive edge of OSC CLKIN and OSC CLK, its output goes low and this via a lead 744 pulls the "A" input of the NAND gate 674 low (the "B" input is being held high at this time). When this happens the output of the NAND gate 674 pulls high the common lead 740. And, as previously described, the latch 612 is reset, returning REF CLK and OSC CLK low and holding them low leaving the RCC 204 with a non-zero remaining count, and the OC 202 with a minimum count.

When the common lead 740 goes high this level is also applied through the inverters 638 and 640 to produce a high level on a lead 746 connected between the output of the inverter 640 and the CLK input of the latch 614. This enables the latch. The "D" input of the latch 614 is connected via a lead 748 to a terminal 750 which is connected to positive supply voltage +VDD. The output "Qbar" (shown as a Q with a line over the top), of the latch 614, is connected via a lead 752 to the "A" input of the NAND gate 676. When the latch 614 is enabled, its output "Qbar" goes low ("Qbar" produces the complement of a signal at "D" at the time when its input "CLK" goes high) and this in turn pulls low the "A" input of the NAND gate 676. The "B" input of the NAND gate 676 and the "A" input of the NAND gate 678 are connected to respective ones of positive supply voltage terminals 754 and 756 (+VDD). The "B" inputs of the NOR gates 682 and 684 are respectively connected to ground. Thus a "low" signal level on the lead 752 is transmitted, with phase inversions and suitable delay, in series through the NAND gate 676, the NOR gate 682, the NAND gate 678, the NOR gate 684 and the inverter 654 to a terminal 760 (OSC LOAD). For so long as the latch 614 is not reset and maintains a "low" on the lead 752, there will be a "high" signal at the terminal 760 (OSC LOAD). The high level at the terminal 760 (OSC LOAD) is applied via the lead 230 to the SLOL 208 (FIG. 4) and actuates circuitry to be described hereinafter.

Figure 8A:
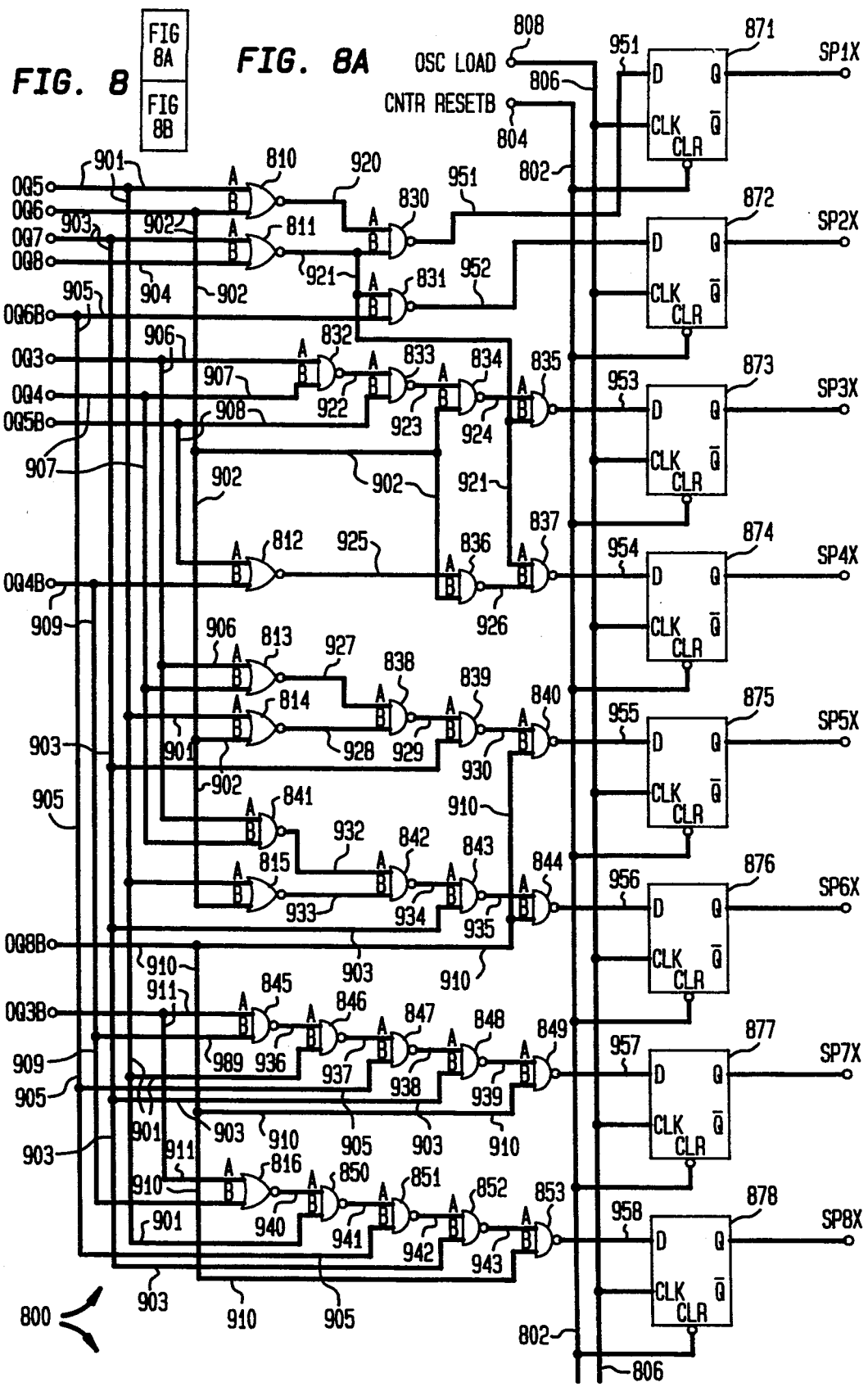
FIGS. 8A and 8B are coupled together.
Figure 8B:
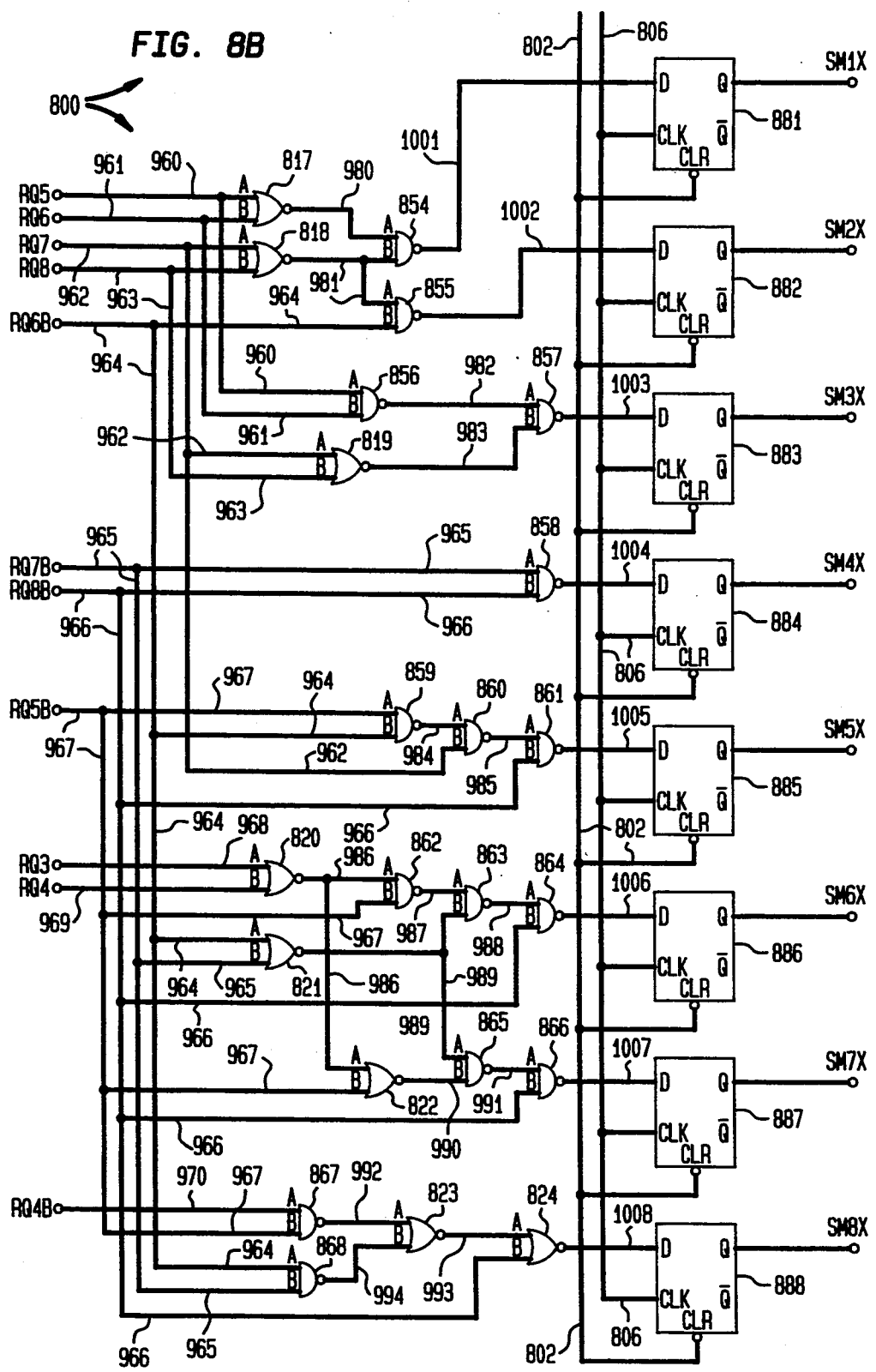

Referring now to FIGS. 8A and 8B taken together, there is shown a detailed circuit diagram of a switching and logic circuit generally indicated at 800. FIG. 8 shows how FIGS. 8A and 8B are coupled together. The circuit 800 performs the functions of the SLOL 208 (see FIG. 4). As seen in FIG. 8A, an upper portion of the circuit 800 is associated with the oscillator counter (OC) 202, and as seen in FIG. 8B, a lower portion of the circuit 800 is associated with the reference clock counter (RCC) 204. The upper portion of the circuit 800 (FIG. 8A) has input terminals respectively designated "OQ3" through "OQ8" for receiving positive-true signals representative of "bits" from corresponding bit positions "3" through "8" of the OC 202, and has input terminals respectively designated "OQ3B" through "OQ6B" and "OQ8B" (note, there is no "OQ7B") for receiving negative-true signals representative of the complements of bits from the OC 202. It is noted that, as previously explained, "bits" in the 1st and 2nd positions of the counter are not used. Similarly, the lower portion of the circuit 800 (FIG. 8B) has input terminals respectively designated "RQ3" through "RQ8" for receiving positive-true signals representative of bits from corresponding positions of the RCC 204, and has input terminals respectively designated "RQ4B" through "RQ8B" (note, there is no "RQ3B") for receiving negative-true signals representative of the complements of bits from the RCC 204. This will be further explained hereinafter.

The circuit 800 has a first control bus 802 (vertically aligned and with horizontal branches) which at its top end (FIG. 8A) is connected to a control terminal 804 (CNTR RESETB) adapted to receive a negative-going reset signal from the terminal 706 (CNTR RESETB) of the logic circuit 600 (FIG. 7). The circuit 800 has a second control bus 806 (vertically aligned and with horizontal branches) which at its top end has a control terminal 808 (OSC LOAD) adapted to receive a positive-going "latch" signal from the terminal 760 (OSC LOAD) of the logic circuit 600. The circuit 800 has eight output terminals respectively designated "SP1X" through "SP8X" (FIG. 8A), and has eight output terminals respectively designated "SM1X" through "SM8X" (FIG. 8B). These output terminals provide positive-true output signals.

The circuit 800 (FIGS. 8A and 8B) comprises a number of NOR gates, NAND gates and "D" flip-flop latches which are interconnected with each other and the input, output and control terminals in a logical combination designed to implement the algorithm illustrated in Table II. Other equivalent wiring patterns and algorithms may be used with the switching logic circuit 800 within the scope of the present invention. The circuit 800 comprises seven NOR gates 810, 811, 812, 813, 814, 815, and 816 (see FIG. 8A) and eight NOR gates 817, 818, 819, 820, 821, 822, 823, and 824 (as seen in FIG. 8B). The circuit 800 further comprises twenty four NAND gates respectively designated 830, 831, 832, 833, 834, 835 836, 837,838, 839, 840, 841, 842, 843, 844, 845, 846, 847 848 849, 850, 851, 852, and 853 (see FIG. 8A) and fifteen NAND gates 854, 855, 856 857 858 859, 860, 861, 862, 863, 864, 865, 866, 867, and 868 (see FIG. 8B). Each of the NOR gates and each of the NAND gates has respective inputs "A" (upper) and "B" (lower) and respective outputs. The circuit 800 further comprises sixteen "D" flip-flop latches respectively designated 871, 872, 873, 874, 875, 876, 877, and 878 (see FIG. 8A) and 881, 882, 883, 884, 885, 886, 887, and 888 (FIG. 8B). These latches (each like the latch 610 of FIG. 7) have terminals respectively designated "D", "Q" "Qbar", "CLR", and "CLK". The "Q" terminal of each of the latches 871 through 878 is connected to a respective one of the output terminals SP1X through SP8, and the "Q" terminal of each of the latches 881 through 888 is connected to a respective one of the output terminals SM1X through SM8X. The "CLK" terminals of all of these latches (FIG. 8A and 8B) are connected to the control bus 806 by integral branches thereof, and the "CLR" terminals of all of these latches are connected to the control bus 802 by its branches.

As seen in FIG. 8A, the input terminal OQ5 is connected via a common lead 901 to the "A" input of the NOR gate 810, to the "A" input of the NOR gate 814, to the "A" input of the NOR gate 815, to the "B" input of the NAND gate 846, and to the "B" input of the NAND gate 850. The input terminal OQ6 is connected via a common lead 902 to the "B" inputs of the NOR gates 810, 814 and 815, and to the "B" inputs of the NAND gates 834 and 836. The input terminal OQ7 is connected via a common lead 903 to the "A" input of the NOR gate 811, and to the "B" inputs of the NAND gates 839, 843, 848, and 852. The input terminal OQ8 is connected via a lead 904 to the "B" input of the NOR gate 811. The input terminal OQ6B is connected via a common lead 905 to the "B" inputs of the NAND gates 831, 847, and 851. The input terminal OQ3 is connected via a common lead 906 to the "A" inputs of the NAND gates 832 and 841, and to the "A" input of the NOR gate 813. The input terminal OQ4 is connected via a common lead 907 to the "B" inputs of the NAND gates 832 and 841, and to the "B" input of the NOR gate 813. The input terminal OQ5B is connected via a common lead 908 to the "B" input of the NAND gate 833, and to the "A" input of the NOR gate 812. The input terminal OQ4B is connected via a common lead 909 to the "B" inputs of the NOR gates 812 and 816, and to the "B" input of the NAND gate 845. The input terminal OQ8B is connected via a common lead 910 to the "B" inputs of the NAND gates 840, 844, 849, and 853. The input terminal OQ3B is connected via a common lead 911 to the "A" input of the NAND gate 845 and to the "A" input of the NOR gate 816.

Still referring to FIG. 8A, the output of the NOR gate 810 is connected via a lead 920 to the A input of the NAND gate 830, and the output of the NOR gate 811 is connected via a common lead 921 to the B inputs of the NAND gates 830 and 835, and to the A inputs of the NAND gates 831 and 837. The output of the NAND gate 832 is connected via a lead 922 to the A input of the NAND gate 833 whose output is connected via a lead 923 to an input of the NAND gate 834 whose output is connected via a lead 924 to the A input of the NAND gate 835. The output of the NOR gate 812 is connected via a lead 925 to the A input of the NAND gate 836 whose output is connected via a lead 926 to the B input of the NAND gate 837. The output of the NOR gate 813 is connected via a lead 927 to the A input of the NAND gate 838. The output of the NOR gate 814 is connected via a lead 928 to the B input of the NAND gate 838. The output of the NAND gate 838 is connected via a lead 929 to the A input of the NAND gate 839 whose output is connected via a lead 930 to the A input of the NAND gate 840. The output of the NAND gate 841 is connected via a lead 932 to the A input of the NAND gate 842, and the output of the NOR gate 815 is connected via a lead 933 to the B input of the NAND gate 842. The NAND gates 845, 846, 847, 848 and 849 have their respective outputs and A inputs connected in series by corresponding ones of the leads 936, 937, 938 and 939. The output of the NOR gate 816 is connected via a lead 940 to the A input of the NAND gate 850. The NAND gates 850, 851, 852, and 853 have their respective outputs and A inputs connected in series by corresponding ones of the leads 941, 942 and 943. The outputs of the eight NAND gates 830, 831, 835, 837, 840, 844, 849, and 853 are connected by respective ones of eight leads 951, 952, 953, 954, 955, 956, 957, and 958 to corresponding "D" terminals of the latches 871 through 878. For example, NAND gate 835 is coupled via lead 953 to the D terminal of latch 873.

Referring now to FIG. 8B, the input terminal RQ5 is connected via a common lead 960 to the A input of the NOR gate 817 and to the A input of the NAND gate 856. The input terminal RQ6 is connected via a common lead 961 to the B input of the NOR gate 817 and to the B input of the NAND gate 856. The input terminal RQ7 is connected via a common lead 962 to the A input of the NOR gate 818, to the A input of the NOR gate 819, and to the B input of the NAND gate 860. The input terminal RQ8 is connected via a common lead 963 to the B inputs of the NOR gates 818 and 819. The input terminal RQ6B is connected via a common lead 964 to the B inputs of the NAND gates 855 and 859, and to the A input of the NOR gate 821 and to the A input of the NAND gate 868. The input terminal RQ7B is connected via a common lead 965 to the A input of the NAND gate 858, to the B input of the NOR gate 821, and to the B input of the NAND gate 868. The input terminal RQ8B is connected via a common lead 966 to the B inputs of the NAND gates 858, 861, 864, and 866, and to the B input of the NOR gate 824. The input terminal RQ5B is connected via a common lead 967 to the A input of the NAND gate 859, to the B input of the NAND gate 862 to the B input of the NOR gate 822, and to the B input of the NAND gate 867. The input terminal RQ3 is connected via a lead 968 to the A input of the NOR gate 820, and the input terminal RQ4 is connected via a lead 969 to the B input of NOR gate 820. The input terminal RQ4B is connected via a lead 970 to the A input of the NAND gate 867.

The output of the NOR gate 817 is connected via a lead 980 to the A input of the NAND gate 854. The output of the NOR gate 818 is connected via a common lead 981 to the B input of the NAND gate 854 and to the A input of the NAND gate 855. The output of the NAND gate 856 is connected via a lead 982 to the A input of the NAND gate 857, and the output of the NOR gate 819 is connected via a lead 983 to the B input of the NAND gate 857. The output of the NAND gate 859 is connected via a lead 984 to the A input of the NAND gate 860 whose output in turn is connected via a lead 985 to the A input of the NAND gate 861. The output of the NOR gate 820 is connected via a common lead 986 to the A input of the NAND gate 862 and to the A input of the NOR gate 822. The output of the NAND gate 862 is connected via a lead 987 to the A input of the NAND gate 863 whose output is connected via a lead 988 to the A input of the NAND gate 864. The output of the NOR gate 821 is connected via a common lead 989 to the B input of the NAND gate 863 and to the A input of the NAND gate 865. The output of the NOR gate 822 is connected via a lead 990 to the B input of the NAND gate 865 whose output is connected via a lead 991 to the A input of the NAND gate 866. The output of the NAND gate 867 is connected via a lead 992 to the A input of the NOR gate 823 whose output is connected via a lead 993 to the A input of the NOR gate 824. The output of the NAND gate 868 is connected via a lead 994 to the B input of the NOR gate 823. The seven NAND gates 854, 855, 857, 858, 861, 864 and 866 and the NOR gate 824 have their outputs connected by respective ones of leads 1001 through 1008 to corresponding "D" terminals of the latches 881 through 888. For example, NAND gate 854 has the output thereof coupled via the lead 1001 to the D terminal of the latch 881, and NAND gate 855 has its output coupled via the lead 1002 to the D terminal of the latch 882.

When a negative-going reset signal is applied to the control bus 802 at the terminal 804 (CNTR RESETB) from the corresponding terminal 706 in the logic circuit 600 (FIG. 7), all of the sixteen latches of the circuit 800 are reset and their respective output terminals "Q" are pulled low. After the counters OC 202 and RCC 204 have been stopped in their counting by the logic circuit 600 (FIG. 7), there is a short time delay provided within the logic circuit 600 by the NAND gates 676 and 678 the NOR gates 682 and 684, and the inverter 654 before a latch signal is provided at the terminal 760 (OSC LOAD). This delay gives the bit signals at the respective positions within the counters time to stabilize (reach steady state) and propagate through the switch logic of FIG. 8 to the input terminals "D" of the output latches. Respective ones of these bit signals and their complements from the counter OC 202 are applied via separate conductors (not shown) within the lead 220 (FIG. 4) to corresponding ones of the input terminals OQ3 through OQ8 and OQ3B through OQ6B and OQ8B (note that reference number OQ7B is not used) as seen in FIG. 8A. Thus, a "bit" in the 3rd position of counter OC 202 is applied to the terminal OQ3, a bit in the 4th position to OQ4, and so on. Similarly, respective ones of the bit signals and their complements from the counter RCC 204 are applied via separate conductors (not shown) within the lead 222 to corresponding ones of the input terminals RQ3 through RQ8 and RQ4B through RQ8B (note, there is no RQ3B) as seen in FIG. 8B. Bits in positions one and two in the two counters are not used, as was previously explained.

When a positive-going signal is applied to the control bus 806 at the terminal 808 (OSC LOAD), the sixteen latches 871 through 878 and 881 through 888 are enabled for data transfer. This then applies to the respective output terminals "Q" the signal levels then present on the respective input terminals "D" of the latches. These signal levels are applied as steady-state "high" or "low" ("on" or "off") levels in a selected sequence to the output terminals SP1X through SP8X and SM1X through SM8X. The output terminals SP1X through SP8X and SM1X through SM8X are connected via separate conductors in the lead 22 (FIG. 4) to the memory 24 and MUX 26 and via separate conductors (not shown) in the lead 34 to the bias unit 36 (FIG. 1). Signals (either high or low) on the output terminals SP1X through SP8X are thus applied to the corresponding input terminals P-1 through P-8 of the bias unit 36 (FIGS. 6A and 6B). Similarly, signals (high or low) on the output terminals SM1X through SM8X are applied to the corresponding input terminals M-1 through M-8 of the bias unit 36.

As explained previously in connection with the algorithm given in Table II, part a), when a count of at least "18" (or "16" in actuality since the 2nd bit is ignored) remains at the end of counting in the oscillator counter OC 202 (RCC 204 has a zero count), the transistor 404 in one stage in the bias unit 36 is turned on to add a single positive increment of current to the I-bias control current. If the count is at least "16", at least one of the 5th bit position, 6th bit position, 7th bit position, 8th bit position, is high. For example, if the 5th bit position is high, through the sequence described above, the input terminal OQ5 (FIG. 8A) is pulled "high". This in turn makes the output of the NOR gate 810 and the A input of the NAND gate 830 go "low", and so its output goes high. This via the lead 951 applies a "high" to the input terminal "D" of the latch 871 which, through its output terminal "Q", applies a high to the output terminal SP1X. This high in turn at input terminal P-1 of the bias unit 36 (FIGS. 6A and 6B) turns on the transistor 404 of the current stage "I-1" thereby adding an increment of current to the current I-bias on the bias lead 424.

In similar fashion for the algorithm for different counts as illustrated in Table II, part a), one or more of the output terminals SP1X through SP8X are pulled "high" to turn on one or more of the current stages "I-1" through "I-8" of the bias unit 36 and apply positive increments of current to the I-bias current. For simplicity in applying the algorithm some of these counts may be rounded up or down slightly as the 1st and 2nd bits are ignored. When any terminal SP1X through SP8X is high, all of the terminals SM1X through SM8X are low, and vice versa.

Where there is a remaining count in the RCC 204 as shown in Table II part b), the various remaining counts in rows 1 through 8 are used to instruct the logic and switching circuit 800 to pull "high" one or more of the output terminals SM1X through SM8X. For simplicity in applying the algorithm, some of these counts may be rounded up or down slightly as the 1st and 2nd bits are ignored. The count of "16" in row 1 indicates one bit in the 5th bit position of the RCC 204 (no bits in the other positions). This then translates into the single input terminal RQ5 (FIG. 8B) being pulled "high". Complement signals at terminals RQ4B, RQ6B, RQ7B and RQ8B (but not RQ5B) are also high (the terminals RQ4, RQ6, RQ7 and RQ8 are low). Thus a "high" on the A input of the NOR gate 817 causes its output and the A input of the NAND gate 854 to go low. As a result, the output of the NAND gate 854 goes high and via the lead 1001 pulls high the input terminal "D" of the latch 881 and in turn this pulls high the output terminal SM1X. The remaining terminals SM2X through SM8X stay "low". A high at the terminal SM1X is in turn applied to the terminal M-1 to turn on the transistor 406 of the current stage "I-1" of the bias unit 36 (FIG. 6). This subtracts an increment of current from the current I-bias as was previously explained. In similar fashion following the algorithm illustrated in Table II, part b), one or more of the output terminals SM1X through SM8X are pulled high as the count in the RCC 204 increases. When any terminal SM1X through SM8X is high, all of the terminals SP1X through SP8X are low.

Various other changes and modifications in the oscillator system illustrated herein may occur to those skilled in the art and may be made without departing from the spirit or scope of the invention as set forth and as defined in the claims. For example, the nominal operating criteria for the ROSC 16 (frequency, bias current, level, range of adjustment, etc.) given herein may be changed within the scope of the present invention. Still further, there may be more or fewer current stages in the bias unit 36 depending on a desired degree of accuracy in the adjustment of oscillator frequency. Still further, the algorithm illustrated in Table II may be modified to obtain different degrees of accuracy or range of frequency adjustment. Furthermore, the current increments added to or subtracted from the current I-bias need not be in equal or nearly equal increments and a non-volatile memory other than the battery powered memory illustrated may be used. Still further, the particular arrangements of logic elements shown in FIGS. 7, 8A and 8B may be changed into different logical combinations to achieve the desired overall functions. The oscillator system may be implemented with other than CMOS technology. Furthermore, the oscillator 12 can be modified such that the bias unit 36 provides control signals to other portions thereof which affect the charging and/or discharging times such that the frequency of oscillation can be adjusted to ensure that it is close to that of a reference clock signal.

What is claimed is:

1. An oscillator system comprising:
    an oscillator having a plurality of n essentially identical stages each having an input and an output with the output of each stage being coupled to the input of the next stage and with the output of a last stage being coupled to the input of a first stage, where n is an odd integer greater than one;
    each of the n stages comprises capacitor means for selectively storing electrical charge, an adjustable source of electrical charge coupled to the capacitor means, and switch means, which is coupled to the capacitor means, for selectively facilitating charging/discharging of the capacitor means so as to control frequency and corresponding time period of an output signal generated by the oscillator at the oscillator output during operation;
    reference clock means for receiving a reference clock signal having a preselected frequency and corresponding time period;

counter and control means for separately counting over a same period of time a number of oscillator time periods and a number of reference clock signal time periods and for generating a count difference between the respective counts of the time periods;

logic means, which is responsive to the count difference generated by the counter and control means, for generating control signals corresponding to the count difference; and bias means, which is responsive to the control signals generated by the logic means and is coupled to the sources of electric charge, for controlling the respective sources of electric charge of the oscillator stages such that the frequency of the oscillator is adjusted in accordance with the count difference so as to ensure that the oscillator frequency is in close agreement with the frequency of the reference clock signal.

2. The oscillator system of claim 1 further comprising:

memory means, which is coupled to the logic means, for storing control signals generated by the logic means; and multiplexer means, which is coupled to the logic means and to the memory means, for coupling control signals from the logic means to the bias means when a reference clock signal is applied to the reference clock means and for coupling control signals stored in the memory means to the bias means in the absence of a reference clock signal.

3. The oscillator system of claim 1 wherein:

the adjustable source of electric charge of an oscillator stage is a first transistor connected as an adjustable current source; and the capacitor means of each stage is a capacitor formed by parasitic capacitance associated with the stage;

the switch means of each stage is a pair of transistors connected as a current mirror whose common control electrode is connected to the input of the stage and whose output is connected in series with the current source, the charging of the capacitor being effected when the current mirror is off, the discharging of the capacitor being effected when the current mirror is on, the charging time of the capacitor being controlled by adjustment of current supplied by the current source, and the discharging time of the capacitor being controlled by adjustment of current supplied by the current source of the preceding stage.

4. The oscillator system of claim 1 further comprising:

non-volatile memory means for storing control signals from the logic means such that once the oscillator frequency has been adjusted to the frequency of a reference clock signal, the oscillator subsequently operates at that frequency even after temporary loss of power, and without a reference clock signal applied to the reference clock means.

5. The oscillator system of claim 3 wherein the bias means provides a current I-bias for controlling the respective first transistors of the oscillator stages, the bias means comprises a plurality of current stages which may be turned on or off for incrementally changing the current I-bias in accordance with control signals from the logic means.

6. An oscillator system comprising:

a ring oscillator (ROSC) comprising an odd plurality of n stages, each stage having a constant current source transistor with a control electrode and having a switch transistor pair with a control electrode, an output of the switch transistor pair being coupled in series with the current source transistor, each stage having an output coupled to a control electrode of a switch transistor pair of the next stage with the output of a last stage being coupled to the control electrode of the switch transistor pair of a first stage;

bias means, which is coupled to the control electrodes of the current source transistors of the n stages, for determining the current through each current source transistor;

logic counter comparator (LCC) means, which is coupled by an output thereof to an input of the bias means, for comparing the frequency of the ROSC with that of a reference clock signal, for determining a numerical difference between the two frequencies, and for generating at the output thereof signals representative of such difference such that the bias means generates signals which are coupled to the ROSC that ensure that the oscillator frequency is in close agreement with the frequency of the reference clock signal.

7. The oscillator system of claim 6 wherein the LCC means comprises:

an oscillator counter (OC) having an input and an output;

a reference clock counter (RCC) having an input and an output;

minimum count detector (MCD) means for determining when either one of the counters has counted down from a preset count to a minimum count, switch logic and output latches (SLOL) means for decoding counts from the counters and for generating a sequence of output signals;

control logic (CL) means for controlling the OC and the RCC and the SLOL; and the CL means having outputs connected to the respective inputs of the OC and RCC counters and the SLOL, and having respective inputs to receive signals from the ROSC and the reference clock as well as inputs to receive initializing signals from a central control system, the CL means having a fourth input connected to an output of the MCD means, the SLOL means having first and second inputs connected to the respective outputs of the OC and RCC counters and a third input connected to an output of the CL means, and the SLOL means having an output connected to the bias means.

8. The oscillator system of claim 6 wherein the bias means is supplied with a stable current and generates a control current I-bias, the bias means having a plurality of "N" of current stages each of which selectively adds to or subtracts from the stable current small increments of current to obtain the I-bias current; and the LCC means generates digital signals for selectively turning on or off one or more of the stages of the bias means such that the frequency of the ROSC is adjusted to closely match that of the reference clock.

9. The oscillator system of claim 8 wherein there are eight stages m in the bias means, and there are five oscillator stages n and the nominal frequency of the ROSC is adjustable by about ±50%.

10. The oscillator system of claim 8 further comprising a non-volatile memory, the digital signals generated by the LCC means being stored in the memory and being subsequently applied to the bias means when the reference clock is not present.

11. An oscillator system comprising:
a ring oscillator (ROSC) comprising an odd plurality of n stages, each stage having a P-channel field effect transistor having a gate and being connected as an adjustable constant current source, and having a first N-channel field effect transistor having a gate and being connected as a switch in series with the P-channel field effect transistor, and having a second N-channel field effect transistor which is diode-connected and shares a common control electrode with the first N-channel field effect transistor, the first and second N-channel transistors being a current mirror;
each stage having an input coupled to the common control electrode of the first and second N-channel field effect transistors, and having an output coupled to respective outputs of the first N-channel field effect transistor and the P-channel transistor;
the output of each stage is coupled to the input of the next stage with the output of an nth stage being coupled to the input of a first stage;
current is supplied during operation of the ring oscillator by the current source P-channel transistor which charges parasitic capacitance associated with the first N-channel transistor and the P-channel transistor of the current stage and the first and second N-channel transistors of the next stage when the first N-channel transistor is turned off, and the first N-channel transistor discharges the capacitor when same is turned on;
the amount of current supplied during charging of the parasitic capacitance being determined by a bias level applied to the gate of the P-channel transistor and the time needed to charge the parasitic capacitance being determined by the amount of current supplied thereto;
the amount of current supplied during discharging of the parasitic capacitance being proportional to the charging current of the previous stage through the action of the current mirror formed by the first and second N-channel transistors, and the time to discharge the parasitic capacitance being determined by this discharging current;
the first N-channel transistor having a larger aspect ratio of width/length than the second N-channel transistor;
bias means for applying an adjustable bias level to the gates of the P-channel transistors of the n stages; and
logic counter comparator (LCC) means for comparing the frequency of the ROSC with that of a reference clock signal and determining a numerical difference between the two frequencies, the LCC generating digital signals corresponding to the numerical difference, and the digital signals being applied to the bias means for adjusting the bias level thereof such that the frequency of the ROSC is adjusted to closely match the frequency of the reference clock signal.

12. The oscillator system of claim 11 further comprising a non-volatile memory connected to receive and store the digital signals and thereafter to apply them to the bias means such that the ROSC operates at a desired frequency even after a reference clock signal is removed from the oscillator system and even though power to the oscillator system has been interrupted.

13. The oscillator system of claim 11 wherein the entire oscillator system is implemented in complementary metal oxide semiconductor (CMOS) technology as part of an integrated circuit chip.

14. An oscillator system comprising:
an oscillator having a plurality of n essentially identical stages, each stage having an input, an output, a capacitor, and an adjustable source of electric charge for charging the capacitor in that stage, the output of each stage being coupled to the input of the next stage with the output of an nth stage being coupled to an input of a first stage, the adjustable source of electric charge having a control terminal;
switch means within each oscillator stage coupled to the input thereof for selectively facilitating charging/discharging of the respective capacitor from the source of electrical charge of that stage, a sequence of charging and discharging of the capacitors of the n stages controlling a frequency and corresponding time period of oscillation of the oscillator;
reference clock means for receiving a reference clock signal having a preselected frequency and corresponding time period;
counter and control means for separately counting over a period of time a number of oscillator time periods and a number of reference clock signal time periods and for generating a count difference between the respective counts of the time periods;
bias means, which has an output coupled to the respective control terminals of the sources of electrical charge, for controlling the charging and discharging times of the respective capacitors of the n stages; and
logic means, which is responsive to the count difference generated by the counter and control means, for generating digital control signals corresponding to count differences, the digital control signals being applied to an input of the bias means for adjusting the output thereof such that the frequency of the oscillator is adjusted in accordance with the count difference so as to ensure the oscillator frequency is in close agreement with the frequency of the reference clock signal.

15. The oscillator system of claim 14 wherein:
the bias means generates a current I-O from a supplied current I-OSC which remains essentially constant with temperature and power supply variations within a useful range;
the bias means having a plurality of m current stages each of which selectively adds to or subtracts from the I-O current increments of current to obtain an I-bias current; and
the logic means generates digital signals for selectively turning on or off one or more of the stages of the bias means so as to adjust I-bias such that the frequency of the oscillator is adjusted to closely match the frequency of the reference clock signal.

16. The oscillator system of claim 14 wherein the oscillator comprises an odd plurality of n stages, each stage having a P-channel field effect transistor connected as an adjustable constant current source with a gate electrode, each stage having a first N-channel field effect transistor with a gate electrode and being connected as a switch in series to ground with the P-channel field effect transistor, and each stage having a second N-channel field effect transistor which is diode-connected and shares a common electrode with the first N-channel field effect transistor, each stage having an input connected to a common gate electrode of the first and second N-channel field effect transistors, and an output connected in common to the first N-channel and the P-channel field effect transistors, there being interelectrode capacity forming the capacitor of that stage, the capacitor being connected between the output and ground, the output of a first stage being connected to the input of the second stage and so on to the nth stage whose output is connected to the input of the first stage, the current supplied by the current source P-channel field effect transistor charging the capacitor when the first N-channel field effect transistor is turned off, the first N-channel field effect transistor discharging the capacitor when the transistor is turned on, the aspect ratio of width/length of the first N-channel field effect transistor being larger than the aspect ratio of the second N-channel field effect transistor, and a bias level applied to the gate electrode of the P-channel field effect transistor controls the current and therefore the time of charging of the capacitor of each stage, and also the discharging time of the capacitor of the next stage through a current mirror formed by the first and second N-channel transistors of the next stage.

17. The oscillator system of claim 14 wherein counter and control means comprises:
   an oscillator counter (OC) having an input and an output;
   a reference clock counter (RCC) having an input and an output;
   minimum count detector (MCD) means for determining when either one of the counters has counted down from a preset count to a minimum count;
   switch logic and output latches (SLOL) means for decoding counts from the counters and for generating a sequence of output signals; and
   control logic (CL) means for controlling the OC, the RCC and the SLOL means;
   the CL means having outputs connected to the respective inputs of the OC and RCC counters and the SLOL means and having respective inputs to receive signals from the oscillator and the reference clock and initializing signals from a central control system, the CL means having a fourth input connected to an output of the MCD means, the SLOL means having first and second inputs connected to the respective outputs of the CL and RCC counters and a third input connected to an output of the CL means, and the SLOL means having an output connected to the bias means.

18. An oscillator system comprising:
   an oscillator having a plurality of n essentially identical stages each having an input and an output with the output of each stage being coupled to the input of the next stage and with the output of the last stage being coupled to the input of the first stage, where n is an odd integer greater than one;
   each of the n stages comprising a field effect transistor T1 of a first conductivity type and a field effect transistor T2 of the opposite conductivity type, each of the T1's and T2's having first and second outputs and a gate;
   the first outputs of all of the T1's being coupled together;
   the first outputs of all of the T2's being coupled together;
   the second output of T1 of each stage being coupled to the second output of T2 of each stage and to the output of that stage;
   the gate of T2 of each stage being coupled to the input of that stage;
   the gates of all of the T1's being coupled together to a control terminal;
   reference clock means for receiving a reference clock signal having a preselected frequency and corresponding time period;
   counter and control means for separately counting over a same period of time a number of oscillator time periods and a number of reference clock signal time periods and for generating a count difference between the respective counts of the time periods;
   logic means, which is responsive to the count difference generated by the counter and control means, for generating control signals corresponding to the count difference; and
   bias means, which is responsive to the control signals generated by the logic means, for controlling the respective oscillator stages such that the frequency of the oscillator is adjusted in accordance with the count difference so as to bring the oscillator frequency into close agreement with the frequency of the reference clock signal.

19. The oscillator system of claim 18 wherein:
   the bias means comprises a plurality of m essentially identical stages each having first and second inputs and an output;
   each of the m stages comprising a field effect transistor T3 of the first conductivity type and field effect transistors T4, T5, and T6 of the opposite conductivity type, each of T3, T4, T5, and T6 having first and second outputs and a gate;
   the first outputs of all of the T3's being coupled together;
   the first outputs of all T6's being coupled together;
   the first outputs of all of the T4's and T5's being coupled together to the output of the bias means;
   the second output of T3 of a stage being coupled to the second output of T4 of that stage;
   the second output of T5 of a stage being coupled to the second output of T6 of that stage;
   the gates of all of the T3's being coupled together to a first control terminal;
   the gates of all the T6's being coupled together to a second control terminal; and
   the gates of T4 and T5 of each stage being coupled to the first and second inputs, respectively, of that stage.

20. The oscillator system of claim 19 wherein the T1 and T3 are P-channel field effect transistors and T2, T4, T5, and T6 are N-channel field effect transistors.

21. An oscillator system comprising:
   an oscillator having a plurality of n stages, each stage having an input, an output, a capacitor, and an adjustable source of electric charge for charging the capacitor in that stage and a switch to discharge the capacitor, the output of each stage being coupled to the input of the next stage with the output of a last stage being coupled to the input of a first stage, and the source of electric charge having a control terminal;
   switch means within each oscillator stage and coupled to the input thereof for facilitating charging of the respective capacitor from the source of electrical charge of that stage, and for facilitating discharge of said capacitor, a sequence of charging and discharging of the capacitors of the n stages controls a frequency and corresponding time period of oscillation of the oscillator;

reference clock means for receiving a reference clock signal having a preselected frequency and corresponding time period;

control and counter means for separately counting over a same period of time a number of oscillator time periods and a number of reference clock signal time periods and for generating a count difference between the respective counts of the time periods;

bias means, which has an input and has an output coupled to the respective control terminals of the sources of electrical charge, for controlling the charging and discharging times of the respective capacitors of the "n" stages;

logic means, having an output and responding to the count difference generated by the control and counter means, for generating control signals in accordance with the count differences, the control signals being applied to the input of the bias means for adjusting the output thereof;

memory means for storing the control signals from the logic means, the memory means being non-volatile and having an output; and multiplexer means for selectively applying to the input of the bias means the control signals from the logic means when a reference clock signal is applied to the reference clock means and for selectively applying to the input of the bias means the controls signals stored in the memory means in the absence of a reference clock signal.

22. An oscillator system comprising:

an oscillator having a plurality of n essentially identical stages each having an input and an output with the output of each stage being coupled to the input of the next stage and with the output of a last stage being coupled to the input of a first stage, where n is an odd integer greater than one;

each of the n stages comprises capacitor means for selectively storing electrical charge, charging/discharging means, which is coupled to the capacitor means, for charging/discharging the capacitor means, the charging/discharging means controlling the frequency and corresponding time period of oscillation of the oscillator;

reference clock means for receiving a reference clock signal having a preselected frequency and corresponding time period;

counter and control means for separately counting over a same period of time a number of oscillator time periods and a number of reference clock signal time periods and for generating a count difference between the respective counts of the time periods;

logic means, which is responsive to the count difference generated by the counter and control means, for generating control signals corresponding to the count difference; and bias means, which is responsive to the control signals generated by the logic means and is coupled to the oscillator, for controlling the rate of charging/discharging of the capacitor means such that the frequency of the oscillator is adjusted in accordance with the count difference so as to ensure that the oscillator frequency is in close agreement with the frequency of the reference clock signal.

23. A method of operating an oscillator having an odd plurality of n stages, each stage having an input, an output, a capacitor, and an adjustable source of current for charging the capacitor in the stage, the output of a first stage being coupled to an input of the second stage and so on to the nth stage whose output is coupled back to the input of a first stage, the method comprising the steps of:

charging the capacitor of a first stage from the adjustable current source thereof;

discharging the capacitor of a second stage in response to the charging of the capacitor of the first stage;

charging the capacitor of a third stage from the adjustable current source thereof in response to the discharging of the capacitor of the second stage, and so on from one successive stage to the next continually around in a ring of the n stages;

comparing a frequency of the oscillator with a frequency of a reference clock signal by simultaneously counting in separate counts a number of time periods of oscillation of the oscillator and the reference clock signal until a predetermined count is reached in either count and then discontinuing counting;

determining a count difference between the counts;

providing for incremental changes in a number of steps in the currents provided by the adjustable sources of current in the plurality of stages; and making changes in the currents provided by the adjustable sources of current in accordance with the determined count difference such that the frequency of oscillation of the oscillator is adjusted to closely match the frequency of the reference clock signal.

24. A method of controlling the frequency of operation of an oscillator comprising the steps of:

arranging a plurality of n capacitors with charging current sources and discharging switches in a ring configuration to form an oscillator;

using charging currents to selectively charge a first capacitor of the n capacitors to cause a discharging through a switch of a second capacitor of the n capacitors, and the discharging of the second capacitor to cause charging currents to charge a third capacitor of the n capacitors, and so on in sequence to an nth capacitor and then back to the first capacitor in a continual sequence of capacitor charging and discharging events which results in an output signal having a frequency and corresponding time period;

comparing the frequency of the oscillator with the frequency of a reference clock signal to determine the difference therein;

adjusting the values of charging currents into the capacitors in accordance with the determined difference between the frequency of the oscillator and the frequency of the reference clock signal so as to cause the frequency of the oscillator to be adjusted so as to be close to the frequency of the reference clock signal; and storing the adjusted value of the charging currents in a non-volatile memory.

25. The method of claim 24 wherein the charging currents are adjusted in step-like increments of current either positive or negative, the adjusting increment or increments of current to the charging currents being selected so as to cause the frequency of the oscillator to be brought into close agreement with the frequency of the reference clock.

26. The method of claim 25 further comprising the steps of:

representing each of the increments of current by a respective binary count value; and determining from the binary count value which one or ones of the current increments are added to or subtracted from the capacitor charging currents.

* * * * *